(12) United States Patent
Nakamura

(10) Patent No.: US 7,990,756 B2
(45) Date of Patent: Aug. 2, 2011

(54) SEMICONDUCTOR MEMORY DEVICE AND METHOD FOR MANUFACTURING SAME

(75) Inventor: Ryoichi Nakamura, Kanagawa (JP)

(73) Assignee: Sony Corporation, Tokyo (JP)

( * ) Notice: Subject to any disclaimer, the term of this patent is extended or adjusted under 35 U.S.C. 154(b) by 259 days.

(21) Appl. No.: 12/211,501

(22) Filed: Sep. 16, 2008

(65) Prior Publication Data

US 2009/0080236 A1    Mar. 26, 2009

(30) Foreign Application Priority Data

Sep. 26, 2007   (JP) ................... 2007-249791

(51) Int. Cl.
*G11C 11/00*   (2006.01)
(52) U.S. Cl. ............... 365/154; 365/49.11; 365/189.09; 365/210.12
(58) Field of Classification Search .................. 365/154, 365/49.11, 189.09, 210.12
See application file for complete search history.

(56) References Cited

U.S. PATENT DOCUMENTS

| | | | | |
|---|---|---|---|---|
| 5,162,889 A | * | 11/1992 | Itomi | ................ 257/69 |
| 2005/0226077 A1 | * | 10/2005 | Itoh et al. | ................ 365/226 |

FOREIGN PATENT DOCUMENTS

| | | |
|---|---|---|
| JP | 06-295999 | 10/1994 |
| JP | 08-037243 | 2/1996 |
| JP | 08-228000 | 9/1996 |
| JP | 2003-059273 | 2/2003 |

OTHER PUBLICATIONS

J. Pille et al.; Implementation of the Cell Broadband Engine in a 65nm SOI Technology Featuring Dual-Supply SRAM Arrays Supporting 6GHz at 1.3V; IEEE International Solid-State Circuits Conference; 2007.
Japanese Office Action issued on Sep. 29, 2009 in connection with JP Application No. 2007-249791.
Japanese Office Action issued on Nov. 2, 2010 in connection with counterpart JP Application No. 2007-249791.

* cited by examiner

*Primary Examiner* — Vu A Le
*Assistant Examiner* — Han Yang
(74) *Attorney, Agent, or Firm* — SNR Denton US LLP

(57) ABSTRACT

Disclosed herein is a semiconductor memory device including a plurality of memory cells including first and second inverters each having first and second driver transistors and first and second load transistors and including first and second memory node, and first and second transfer transistors. The of the first and second transfer transistors is connected to each of the first and memory nodes respectively. The memory cell is connected to a bit line and complementary bit line via the first and second transfer transistors respectively wherein a supply voltage applied to the bit line and the complementary bit line is lower than a supply voltage applied to the load transistors, and at least a memory-node-side end of a gate insulating film of the first driver transistor, second driver transistor, first load transistor, and the second load transistor have a thickness larger than a thickness of a gate insulating film of the other part.

6 Claims, 21 Drawing Sheets

SEMICONDUCTOR MEMORY DEVICE AND METHOD FOR MANUFACTURING SAME

CROSS REFERENCES TO RELATED APPLICATIONS

The present invention contains subject matter related to Japanese Patent Application JP 2007-249791 filed in the Japan Patent Office on Sep. 26, 2007, the entire contents of which being incorporated herein by reference.

BACKGROUND OF THE INVENTION

1. Field of the Invention

The present invention relates to a semiconductor memory device and a method for manufacturing the same, and particularly to a semiconductor device having a static random access memory (SRAM) memory cell and a method for manufacturing the same.

2. Description of the Related Art

As semiconductor memory devices, e.g. a dynamic random access memory (DRAM) and a static random access memory (SRAM) are widely used.

Several types of the SRAM memory cell are known. For example, an SRAM memory cell of the smallest configuration is composed of two p-channel metal-oxide-semiconductor (PMOS) transistors and four n-channel metal-oxide-semiconductor (NMOS) transistors, i.e. total six MOS field effect transistors (MOSFETs).

The SRAM is advantageous in the following features over a semiconductor memory device, such as the DRAM, requiring a capacitor exclusively for the memory and so on in addition to a transistor: favorable affinity for a pure logic process; simplified peripheral circuitry due to no necessity for refresh operation for stored data, which is required in the DRAM; and high-speed accessibility. Thus, the SRAM is widely used as a memory device that is required to have high speed and simplicity and has a comparatively-low capacity, such as a cache memory and a memory of a portable terminal.

FIG. 20A is an equivalent circuit diagram of an SRAM memory cell having six MOSFETs.

This SRAM memory cell has load transistors LTr1 and LTr2 as two PMOS transistors, driver transistors DTr1 and DTr2 as two NMOS transistors, and transfer transistors TTr1 and TTr2 as two NMOS transistors.

The drain of each of the load transistor LTr1 and the driver transistor DTr1 is connected to one memory node ND, and the gate of each of these transistors is connected to the other memory node $\overline{ND}$. The source of the load transistor LTr1 is connected to a supply voltage Vcs, and the source of the driver transistor DTr1 is connected to a reference potential. By this load transistor LTr1 and the driver transistor DTr1, one CMOS inverter that has the other memory node $\overline{ND}$ as its input and has the one memory node ND as its output is formed.

The drain of each of the load transistor LTr2 and the driver transistor DTr2 is connected to the other memory node $\overline{ND}$, and the gate of each of these transistors is connected to the one memory node ND. The source of the load transistor LTr2 is connected to the supply voltage Vcs, and the source of the driver transistor DTr2 is connected to the reference potential. By this load transistor LTr2 and the driver transistor DTr2, one CMOS inverter that has the one memory node ND as its input and has the other memory node $\overline{ND}$ as its output is formed.

The input and output of the CMOS inverter composed of the load transistor LTr1 and the driver transistor DTr1 and the output and input of the CMOS inverter composed of the load transistor LTr2 and the driver transistor DTr2 are connected to each other in a ring manner, and thereby one memory circuit is formed.

The gate of the transfer transistor TTr1 is connected to a word line WL, the drain thereof is connected to a bit line BL, and the source thereof is connected to the one memory node ND. The gate of the transfer transistor TTr2 is connected to the word line WL, the drain thereof is connected to a complementary bit line $\overline{BL}$, and the source thereof is connected to the other memory node $\overline{ND}$.

The potential of the bit line BL is set to an external supply voltage Vdd. The potential of the cell-inside power supply Vcc is set to Vcs. The cell-inside power supply is connected via the load transistors LTr1 and LTr2 to the memory nodes ND and $\overline{ND}$. For simplification of the power supply circuit for example, the external power supply is typically equalized to the internal power supply (Vdd=Vcs).

As a related art, to address unstable operation of an SRAM due to the size reduction thereof, a method of employing different gate insulating film thicknesses for the MOSFETs included in an SRAM memory cell has been proposed.

For example, Japanese Patent Laid-open Nos. Hei 6-295999 and Hei 8-37243 disclose a method in which the thickness of the gate insulating films of the transfer transistors TTr1 and TTr2 is set larger than that of the gate insulating films of the driver transistors DTr1 and DTr2 to thereby enhance the static noise margin (SNM) characteristic of the SRAM and strengthen the resistance against noise from the bit line BL.

However, this method involves a problem that the lowering of the transistor capability of the transfer transistors TTr1 and TTr2 is caused and therefore the lowering of the read speed and the deterioration of the write margin are caused.

In recent years, an SRAM dual-power-supply technique in which the cell-inside voltage is set higher than the bit line voltage (Vdd<Vcs) has been proposed (refer to e.g. Implementation of the CELL Broadband Engine™ in a 65 nm SOI Technology Featuring Dual-Supply SRAM Arrays Supporting 6 GHz at 1.3V, J. Pille et al., 2007 IEEE International Solid-State Circuits Conference, pp. 322-324). Setting Vcs higher can increase the amplitude of the inverters formed based on the driver transistors DTr1 and DTr2 and the load transistors LTr1 and LTr2, and setting Vdd lower can reduce noise from the external.

This can avoid the lowering of the read speed and the deterioration of the write margin, and can stabilize the SRAM operation.

However, although the SRAM dual-power-supply technique (Vdd<Vcs) allows the stabilization of the SRAM operation, it involves increase in the standby leakage due to increase in the leakage from the gate insulating film, and the deterioration of the reliability of the gate insulating film. The mechanism thereof will be described below.

FIG. 20B is a schematic sectional view for explaining three leakage paths that exist across the gate insulating film of each transistor.

A gate insulating film 101 is formed on a semiconductor substrate 100, and a gate electrode 102 is formed thereon. Sidewall spacers 103 are formed on both the sides of the gate electrode. In the partial portions of the semiconductor substrate 100 on both the sides of the gate electrode 102, a source region 104S and a drain region 104D are formed. In this manner, a MOSFET is formed.

This configuration involves three kinds of leakage: leakage "a" that occurs between the gate electrode and the channel part when the transistor is in the on-state; leakage "b" that occurs across the overlapping part between the source and the gate electrode both when the transistor is in the on-state and when it is in the off-state; and leakage "c" that occurs across the overlapping part between the drain and the gate electrode both when the transistor is in the on-state and when it is in the off-state.

A discussion will be made below about the leakage in the standby state of the SRAM when the SRAM dual-power-supply technique (Vdd<Vcs) is used for these three kinds of leakage.

The standby state refers to the inactive state in which the memory nodes ND/ND are fixed at High/Low or Low/High ("High" corresponds to the state of the high voltage Vcc=Vcs, and "Low" corresponds to the state of the low voltage Vss=0). In the standby state, the transfer transistors TTr1 and TTr2 are in the off-state, i.e., the word line WL connected to the gates of the transfer transistors TTr1 and TTr2 is at 0 V, and the bit line BL is generally fixed at Vdd. This standby state occupies most part of the SRAM operation.

FIG. 21 is a schematic diagram for explaining the leakage in the standby state in which the memory node ND is at High (Vcc=Vcs) and the memory node ND is at Low (Vss=0). For three paths of the respective transistors, the place across which a potential difference arises and leakage occurs is indicated by an arrowhead. In FIG. 21, the dashed-line arrowhead indicates the place across which a potential difference of Vcs arises, and the full-line arrowhead indicates the place across which a potential difference of Vdd arises.

In this manner, due to the use of the dual power supply (Vdd<Vcs), the potential difference applied to the gate insulating film differs from part to part, which causes increase in the standby leakage and the deterioration of the reliability and resistance of the gate insulating film.

As a countermeasure against the increase in the standby leakage due to the dual power supply, a method in which the thickness of the gate insulating film is designed corresponding to the high voltage Vcs will be available. However, this thickness design is redundant for the place to which only the low voltage Vdd is applied, and thus leads to the lowering of the operating speed of the SRAM.

SUMMARY OF THE INVENTION

There is a need for the present invention to provide a semiconductor memory device that allows reduced standby leakage and a method for manufacturing the same.

According to an embodiment of the present invention, there is provided a semiconductor memory device including a plurality of memory cells configured to be integrated in the semiconductor memory device and each include a first inverter, a second inverter, a first transfer transistor, and a second transfer transistor. The first inverter has a first driver transistor and a first load transistor formed over a semiconductor substrate, and includes a first memory node. The second inverter has a second driver transistor and a second load transistor formed over the semiconductor substrate, and includes a second memory node. The first transfer transistor is connected to the first memory node, and the second transfer transistor is connected to the second memory node. The memory cell is connected to a bit line via the first transfer transistor and is connected to a complementary bit line via the second transfer transistor. The supply voltage applied to the bit line and the complementary bit line is lower than the supply voltage applied to a source/drain region of the first load transistor on the opposite side to the first memory node and a source/drain region of the second load transistor on the opposite side to the second memory node. At least a memory-node-side end of a gate insulating film of the first driver transistor, the memory-node-side end of a gate insulating film of the second driver transistor, a memory-node-side end of a gate insulating film of the first load transistor, and a memory-node-side end of a gate insulating film of the second load transistor have a thickness larger than the thickness of a gate insulating film of the other part.

In the semiconductor memory device according to this embodiment of the present invention, one memory cell has six transistors: the first driver transistor, the first load transistor, the first transfer transistor, the second driver transistor, the second load transistor, and the second transfer transistor. The first driver transistor and the first load transistor serve as the first inverter, and form the first memory node. The second driver transistor and the second load transistor serve as the second inverter, and form the second memory node. The bit line is connected to the first memory node via the first transfer transistor, and the complementary bit line is connected to the second memory node via the second transfer transistor.

The supply voltage applied to the bit line and the complementary bit line is lower than the supply voltage applied to the source/drain region of the first load transistor on the opposite side to the first memory node and the source/drain region of the second load transistor on the opposite side to the second memory node.

Furthermore, at least the memory-node-side end of the gate insulating film of the first driver transistor, the memory-node-side end of the gate insulating film of the second driver transistor, the memory-node-side end of the gate insulating film of the first load transistor, and the memory-node-side end of the gate insulating film of the second load transistor have a thickness larger than the thickness of the gate insulating film of the other part.

According to another embodiment of the present invention, there is provided another semiconductor memory device including a plurality of memory cells configured to be integrated in the semiconductor memory device and each include a first inverter, a second inverter, a first transfer transistor, and a second transfer transistor. The first inverter has a first driver transistor and a first load transistor formed over a semiconductor substrate, and includes a first memory node. The second inverter has a second driver transistor and a second load transistor formed over the semiconductor substrate, and includes a second memory node. The first transfer transistor is connected to the first memory node, and the second transfer transistor is connected to the second memory node. The memory cell is connected to a bit line via the first transfer transistor and is connected to a complementary bit line via the second transfer transistor. The supply voltage applied to the bit line and the complementary bit line is equal to the supply voltage applied to a source/drain region of the first load transistor on the opposite side to the first memory node and a source/drain region of the second load transistor on the opposite side to the second memory node. At least a memory-node-side end of a gate insulating film of the first driver transistor, the memory-node-side end of a gate insulating film of the second driver transistor, a memory-node-side end of a gate insulating film of the first load transistor, and a memory-node-side end of a gate insulating film of the second load transistor have a thickness larger than the thickness of a gate insulating film of the other part.

In the semiconductor memory device according to this embodiment of the present invention, one memory cell has six transistors: the first driver transistor, the first load transistor, the first transfer transistor, the second driver transistor, the second load transistor, and the second transfer transistor. The first driver transistor and the first load transistor serve as the first inverter, and form the first memory node. The second driver transistor and the second load transistor serve as the second inverter, and form the second memory node. The bit line is connected to the first memory node via the first transfer transistor, and the complementary bit line is connected to the second memory node via the second transfer transistor.

The supply voltage applied to the bit line and the complementary bit line is equal to the supply voltage applied to the source/drain region of the first load transistor on the opposite side to the first memory node and the source/drain region of the second load transistor on the opposite side to the second memory node.

Furthermore, at least the memory-node-side end of the gate insulating film of the first driver transistor, the memory-node-side end of the gate insulating film of the second driver transistor, the memory-node-side end of the gate insulating film of the first load transistor, and the memory-node-side end of the gate insulating film of the second load transistor have a thickness larger than the thickness of the gate insulating film of the other part.

According to yet another embodiment of the present invention, there is provided a method for manufacturing a semiconductor memory device in which a plurality of memory cells are integrated. Each of the memory cells includes a first inverter, a second inverter, a first transfer transistor, and a second transfer transistor. The first inverter has a first driver transistor and a first load transistor formed over a semiconductor substrate, and includes a first memory node. The second inverter has a second driver transistor and a second load transistor formed over the semiconductor substrate, and includes a second memory node. The first transfer transistor is connected to the first memory node, and the second transfer transistor is connected to the second memory node. The memory cell is connected to a bit line via the first transfer transistor and is connected to a complementary bit line via the second transfer transistor. The supply voltage applied to the bit line and the complementary bit line is lower than the supply voltage applied to a source/drain region of the first load transistor on the opposite side to the first memory node and a source/drain region of the second load transistor on the opposite side to the second memory node. The method includes a step of, in formation of gate insulating films of the first driver transistor, the second driver transistor, the first load transistor, the second load transistor, the first transfer transistor, and the second transfer transistor, increasing the thickness of at least a memory-node-side end of the gate insulating film of the first driver transistor, a memory-node-side end of the gate insulating film of the second driver transistor, a memory-node-side end of the gate insulating film of the first load transistor, and a memory-node-side end of the gate insulating film of the second load transistor compared with the gate insulating film of the other part.

The method for manufacturing a semiconductor memory device according to this embodiment of the present invention is a method for manufacturing the following semiconductor memory device. Specifically, one memory cell has six transistors: the first driver transistor, the first load transistor, the first transfer transistor, the second driver transistor, the second load transistor, and the second transfer transistor. The first driver transistor and the first load transistor serve as the first inverter, and form the first memory node. The second driver transistor and the second load transistor serve as the second inverter, and form the second memory node. The bit line is connected to the first memory node via the first transfer transistor, and the complementary bit line is connected to the second memory node via the second transfer transistor. The supply voltage applied to the bit line and the complementary bit line is lower than the supply voltage applied to the source/drain region of the first load transistor on the opposite side to the first memory node and the source/drain region of the second load transistor on the opposite side to the second memory node. In this method, in the formation of the gate insulating films of the first driver transistor, the second driver transistor, the first load transistor, the second load transistor, the first transfer transistor, and the second transfer transistor, at least the memory-node-side end of the gate insulating film of the first driver transistor, the memory-node-side end of the gate insulating film of the second driver transistor, the memory-node-side end of the gate insulating film of the first load transistor, and the memory-node-side end of the gate insulating film of the second load transistor are increased in thickness compared with the gate insulating film of the other part.

According to yet another embodiment of the present invention, there is provided another method for manufacturing a semiconductor memory device in which a plurality of memory cells are integrated. Each of the memory cells includes a first inverter, a second inverter, a first transfer transistor, and a second transfer transistor. The first inverter has a first driver transistor and a first load transistor formed over a semiconductor substrate, and includes a first memory node. The second inverter has a second driver transistor and a second load transistor formed over the semiconductor substrate, and includes a second memory node. The first transfer transistor is connected to the first memory node, and the second transfer transistor is connected to the second memory node. The memory cell is connected to a bit line via the first transfer transistor and is connected to a complementary bit line via the second transfer transistor. The supply voltage applied to the bit line and the complementary bit line is equal to the supply voltage applied to a source/drain region of the first load transistor on the opposite side to the first memory node and a source/drain region of the second load transistor on the opposite side to the second memory node. The method includes a step of, in formation of gate insulating films of the first driver transistor, the second driver transistor, the first load transistor, the second load transistor, the first transfer transistor, and the second transfer transistor, increasing the thickness of at least a memory-node-side end of the gate insulating film of the first driver transistor, a memory-node-side end of the gate insulating film of the second driver transistor, a memory-node-side end of the gate insulating film of the first load transistor, and a memory-node-side end of the gate insulating film of the second load transistor compared with the gate insulating film of the other part.

The method for manufacturing a semiconductor memory device according to this embodiment of the present invention is a method for manufacturing the following semiconductor memory device. Specifically, one memory cell has six transistors: the first driver transistor, the first load transistor, the first transfer transistor, the second driver transistor, the second load transistor, and the second transfer transistor. The first driver transistor and the first load transistor serve as the first inverter, and form the first memory node. The second driver transistor and the second load transistor serve as the second inverter, and form the second memory node. The bit line is connected to the first memory node via the first transfer transistor, and the complementary bit line is connected to the second memory node via the second transfer transistor. The supply voltage applied to the bit line and the complementary bit line is equal to the supply voltage applied to the source/drain region of the first load transistor on the opposite side to the first memory node and the source/drain region of the second load transistor on the opposite side to the second memory node. In this method, in the formation of the gate insulating films of the first driver transistor, the second driver transistor, the first load transistor, the second load transistor, the first transfer transistor, and the second transfer transistor, at least the memory-node-side end of the gate insulating film of the first driver transistor, the memory-node-side end of the gate insulating film of the second driver transistor, the memory-node-side end of the gate insulating film of the first load transistor, and the memory-node-side end of the gate insulating film of the second load transistor are increased in thickness compared with the gate insulating film of the other part.

In the semiconductor memory devices of the embodiments of the present invention, regarding the gate insulating films of six transistors included in the memory cell, the part to which a relatively-high voltage is applied during the standby state and thus across which leakage easily occurs in the standby state is designed to have a larger thickness, which makes it possible to reduce the standby leakage.

In the methods for manufacturing a semiconductor memory device according to the embodiments of the present invention, the gate insulating films of six transistors included in the memory cell are manufactured in such a way that the part to which a relatively-high voltage is applied during the standby state and thus across which leakage easily occurs in the standby state has a larger thickness, which makes it possible to manufacture a semiconductor memory device that allows reduced standby leakage.

DETAILED DESCRIPTION OF THE PREFERRED EMBODIMENTS

Semiconductor memory devices and methods for manufacturing the same according to embodiments of the present invention will be described below with reference to the drawings.

First Embodiment

Figure 1:
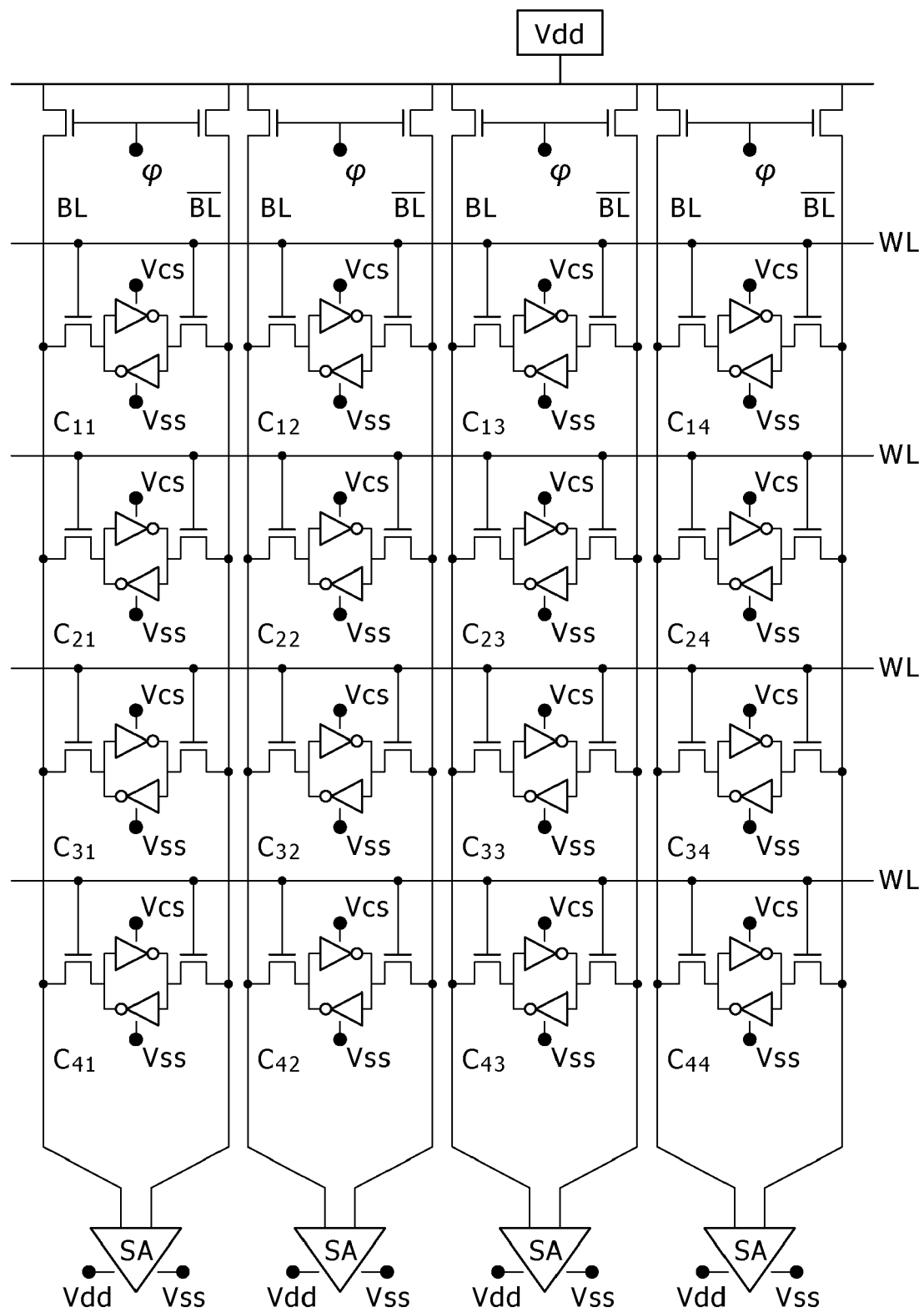
FIG. 1 is a circuit diagram of an SRAM as a semiconductor memory device according to a first embodiment of the present invention.

FIG. 1 is a circuit diagram of an SRAM as the semiconductor memory device according to a first embodiment of the present embodiment, and 4×4=16 memory cells $C_{11}$ to $C_{44}$ are shown in FIG. 1.

The memory cells $C_{11}$ to $C_{44}$ are provided at the intersections between a word line WL and bit lines BL and $\overline{BL}$. Each of the memory cells $C_{11}$ to $C_{44}$ includes two inverters and two transfer transistors. The bit line BL is connected to one transfer transistor, and the complementary bit line $\overline{BL}$ is connected to the other transfer transistor.

The internal supply voltages for the inverters in each memory cell are Vcs and Vss, and the external supply voltage applied to the bit lines BL and $\overline{BL}$ is Vdd.

At the time of reading, the output of the bit lines BL and $\overline{BL}$ is amplified by a sense amplifier SA so as to be read out.

Figure 2A:
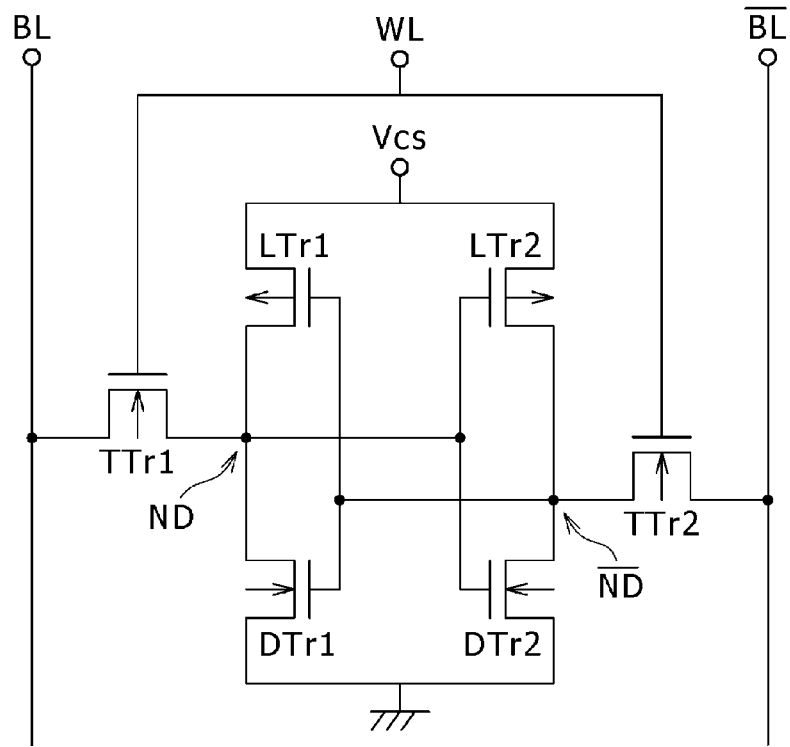
FIG. 2A is an equivalent circuit diagram of one memory cell having six MOSFETs in the SRAM as the semiconductor memory device according to the first embodiment of the present invention.

FIG. 2A is an equivalent circuit diagram of one memory cell having six MOSFETs in the SRAM as the semiconductor memory device according to the present embodiment.

For example, the memory cell has a first load transistor LTr1 and a second load transistor LTr2 as two PMOS transistors, a first driver transistor DTr1 and a second driver transistor DTr2 as two NMOS transistors, and a first transfer transistor TTr1 and a second transfer transistor TTr2 as two NMOS transistors.

The drain of each of the first load transistor LTr1 and the first driver transistor DTr1 is connected to a first memory node ND, and the gate of each of these transistors is connected to a second memory node $\overline{ND}$. The source of the first load transistor LTr1 is connected to a supply voltage Vcs, and the source of the first driver transistor DTr1 is connected to a reference potential. By the first load transistor LTr1 and the first driver transistor DTr1, a first CMOS inverter that has the second memory node $\overline{ND}$ as its input and has the first memory node ND as its output is formed.

The drain of each of the second load transistor LTr2 and the second driver transistor DTr2 is connected to the second memory node $\overline{ND}$, and the gate of each of these transistors is connected to the first memory node ND. The source of the second load transistor LTr2 is connected to the supply voltage Vcs, and the source of the second driver transistor DTr2 is connected to the reference potential. By the second load transistor LTr2 and the second driver transistor DTr2, a second CMOS inverter that has the first memory node ND as its input and has the second memory node $\overline{ND}$ as its output is formed.

The input and output of the first CMOS inverter composed of the first load transistor LTr1 and the first driver transistor DTr1 and the output and input of the second CMOS inverter composed of the second load transistor LTr2 and the second driver transistor DTr2 are connected to each other in a ring manner, and thereby one memory circuit called a flip-flop is formed.

The gate of the first transfer transistor TTr1 is connected to the word line WL, the drain thereof is connected to the bit line BL, and the source thereof is connected to the first memory node ND. The gate of the second transfer transistor TTr2 is connected to the word line WL, the drain thereof is connected to the complementary bit line $\overline{BL}$, and the source thereof is connected to the second memory node $\overline{ND}$.

Figure 2B:
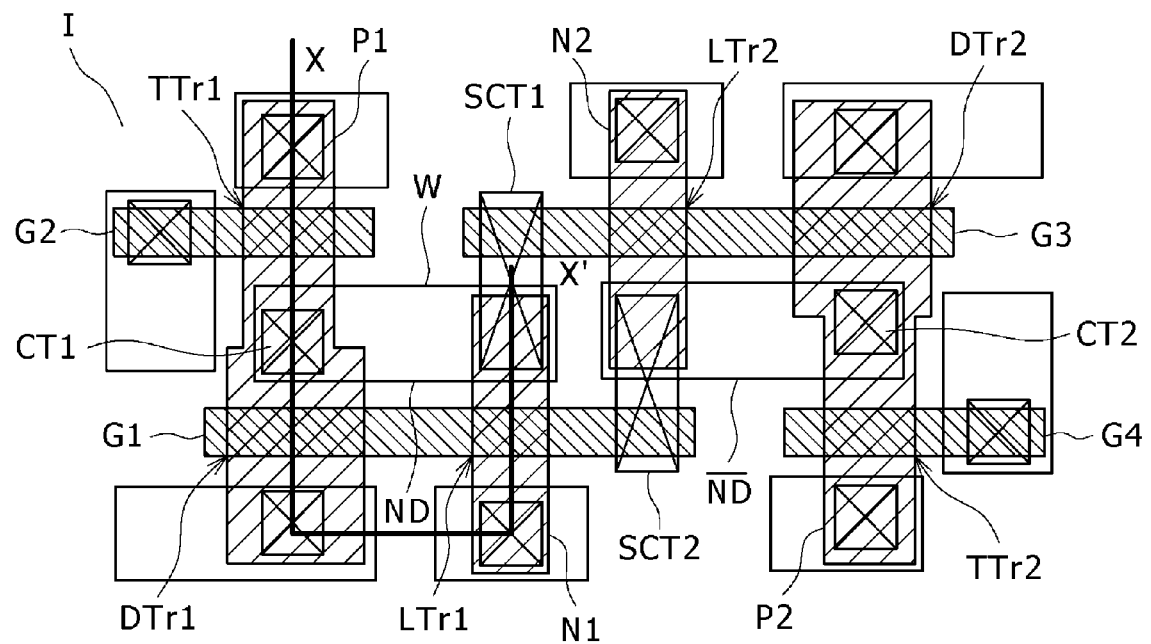
FIG. 2B is a plan view showing the layout of one memory cell in the SRAM.

FIG. 2B is a plan view showing the layout of one memory cell in the SRAM according to the present embodiment.

A first P-type semiconductor region P1, a second P-type semiconductor region P2, a first N-type semiconductor region N1, and a second N-type semiconductor region N2 are isolated from each other by an element isolation region I. Each of the first P-type semiconductor region P1, the second P-type semiconductor region P2, the first N-type semiconductor region N1, and the second N-type semiconductor region N2 is formed of a well formed in the semiconductor substrate or the semiconductor substrate itself.

A first gate electrode G1, a second gate electrode G2, a third gate electrode G3, and a fourth gate electrode G4 are formed with the illustrated layout in such a manner as to cross the above-described respective semiconductor regions. Furthermore, source/drain regions are formed in the surface parts of the respective semiconductor regions other than the respective gate electrode formation regions, so that the first and second load transistors LTr1 and LTr2 as two PMOS transistors, the first and second driver transistors DTr1 and DTr2 as two NMOS transistors, and the first and second transfer transistors TTr1 and TTr2 as two NMOS transistors are formed.

The region ranging from the source/drain region of the first load transistor LTr1 as a PMOS transistor to the third gate electrode G3 is opened in a continuous manner, and a common contact SCT1 connecting the third gate electrode G3 to the source/drain region of the first load transistor LTr1 is formed.

In addition, an opening is formed for the source/drain region connecting the first driver transistor DTr1 to the first transfer transistor TTr1, and a contact CT1 is formed.

The common contact SCT1 and the contact CT1 are connected to each other by an upper-layer interconnect W so that this part serves as the first memory node ND.

On the other hand, the region ranging from the source/drain region of the second load transistor LTr2 as a PMOS transistor to the first gate electrode G1 is opened in a continuous manner, and a common contact SCT2 connecting the first gate electrode G1 to the source/drain region of the second load transistor LTr2 is formed.

In addition, an opening is formed for the source/drain region connecting the second driver transistor DTr2 to the second transfer transistor TTr2, and a contact CT2 is formed.

The common contact SCT2 and the contact CT2 are connected to each other by the upper-layer interconnect W so that this part serves as the second memory node $\overline{ND}$.

The source/drain regions other than the above-described ones are each connected to the upper-layer interconnect via a contact so as to be connected to the supply voltage Vcs, the reference potential, the bit line, or the complementary bit line.

The supply voltage Vdd applied to the bit line BL and the complementary bit line $\overline{BL}$ is lower than the supply voltage Vcs applied to the source/drain region of the first load transistor LTr1 on the opposite side to the first memory node ND and the source/drain region of the second load transistor LTr2 on the opposite side to the second memory node $\overline{ND}$. That is, in this SRAM, the cell-inside voltage is set higher than the bit line voltage (Vdd<Vcs), i.e., a dual power supply is employed.

Furthermore, at least the memory-node-side end of the gate insulating film of the first driver transistor DTr1, the memory-node-side end of the gate insulating film of the second driver transistor DTr2, the memory-node-side end of the gate insulating film of the first load transistor LTr1, and the memory-node-side end of the gate insulating film of the second load transistor LTr2 have a thickness larger than that of the gate insulating film of the other part. In the present embodiment, e.g. the gate insulating film of the first driver transistor DTr1, the gate insulating film of the second driver transistor DTr2, the gate insulating film of the first load transistor LTr1, and the gate insulating film of the second load transistor LTr2 have a thickness larger than that of the gate insulating film of the first transfer transistor TTr1 and the gate insulating film of the second transfer transistor TTr2.

The reason why the thicknesses of the gate insulating films are designed in the above-described manner will be described below.

Table 1 and Table 2 show the result of analysis on the voltages applied in the standby state to three leakage paths across the gate insulating film of each of the MOSFETs included in a memory cell of the dual-power-supply SRAM (Vcs>Vdd). Table 1 shows the case in which the first memory node is at High and the second memory node is at Low. Table 2 shows the case in which the first memory node is at Low and the second memory node is at High.

TABLE 1

|  | LTr | | DTr | | TTr | |
| --- | --- | --- | --- | --- | --- | --- |
|  | LTr1 | LTr2 | DTr1 | DTr2 | TTr1 | TTr2 |
| ON/OFF | ON | OFF | OFF | ON | OFF | OFF |
| Ch part | Vcs | — | — | Vcs | — | — |
| Node end | Vcs | Vcs | Vcs | Vcs | Vcs | 0 |
| power supply end | Vcs | 0 | 0 | Vcs | Vdd | Vdd |

TABLE 2

|  | LTr | | DTr | | TTr | |
| --- | --- | --- | --- | --- | --- | --- |
|  | LTr1 | LTr2 | DTr1 | DTr2 | TTr1 | TTr2 |
| ON/OFF | OFF | ON | ON | OFF | OFF | OFF |
| Ch part | — | Vcs | Vcs | — | — | — |
| Node end | Vcs | Vcs | Vcs | Vcs | 0 | Vcs |
| power supply end | 0 | Vcs | Vcs | 0 | Vdd | Vdd |

In Table 1 and Table 2, three leakage paths of the MOSFETs in the memory cell are referred to as a Ch (channel) part, a Node (node) end, and a power supply end, respectively.

The channel part refers to the leakage path across the channel of the transistor in the on-state, and the channel part is the largest in area.

On the other hand, the overlapping part between the source/drain region and the gate electrode, on the SRAM node side, is referred to as the Node end, and the overlapping part on the opposite side (the Vcc side for the load transistor, the Vss side for the driver transistor, and the bit line side for the transfer transistor) is referred to as the power supply end.

In the respective tables, regarding two standby states (the first/second memory nodes are at High/Low or Low/High), the ON/OFF states of the respective transistors and the voltages applied to the respective leakage path parts are shown.

In the case of the driver transistors and the load transistors, either one of the transistors on the first inverter side and on the second inverter side is in the ON-state, while the other is in the OFF-state.

The transfer transistors are in the OFF-state in both the cases.

The voltage applied to the gate insulating film on the channel part of the transistor in the OFF-state is not zero but extremely low because a depletion layer capacitor arising in the semiconductor substrate is added in series thereto. In the tables, this low voltage is expressed as "−".

Table 3 shows the result of ranking of the stress states of the channel part, the Node end, and the power supply end of the respective transistors, derived from the voltages applied to the respective parts and the voltage application times in the standby state based on the analysis shown in Table 1 and Table 2.

TABLE 3

|  | Ch part | Node end | power supply end |
| --- | --- | --- | --- |
| area | large | small | small |
| LTr | B | A | B |
| DTr | B | A | B |
| TTr | C | B | C |

In Table 3, the stress state of the part to which the voltage Vcs is always applied during the standby state is ranked as A. The stress state of the part to which the voltage Vcs is applied for the time half the standby time is ranked as B. The stress state of the part to which only a voltage equal to or lower than Vdd is applied is ranked as C.

The following fact is apparent from Table 3. Specifically, the voltage Vcs is applied to the entire region of the load transistors and the driver transistors, and particularly the Node ends thereof always receive the application of the voltage Vcs and thus in the high-stress state. In contrast, as for the transfer transistors, the voltage Vcs is applied only to the Node end, which is small in area, for the ½ time.

It is desirable that, in the memory cell of the dual-power-supply SRAM (Vcs>Vdd), the thickness of the gate insulating film be set large selectively for the part to which high stress is applied.

Therefore, based on the result shown in Table 3, the configuration is employed in which at least the memory-node-side end of the gate insulating film of the first driver transistor DTr1, the memory-node-side end of the gate insulating film of the second driver transistor DTr2, the memory-node-side end of the gate insulating film of the first load transistor LTr1, and the memory-node-side end of the gate insulating film of the second load transistor LTr2 have a thickness larger than that of the gate insulating film of the other part.

Based on the result shown in Table 3, the present embodiment is designed with attention paid on the load transistors LTr and the driver transistors DTr, whose stress states are ranked as A and B. Specifically, the present embodiment employs the configuration in which the gate insulating film of the first driver transistor DTr1, the gate insulating film of the second driver transistor DTr2, the gate insulating film of the first load transistor LTr1, and the gate insulating film of the second load transistor LTr2 have a thickness larger than that of the gate insulating film of the first transfer transistor TTr1 and the gate insulating film of the second transfer transistor TTr2.

Figure 3:
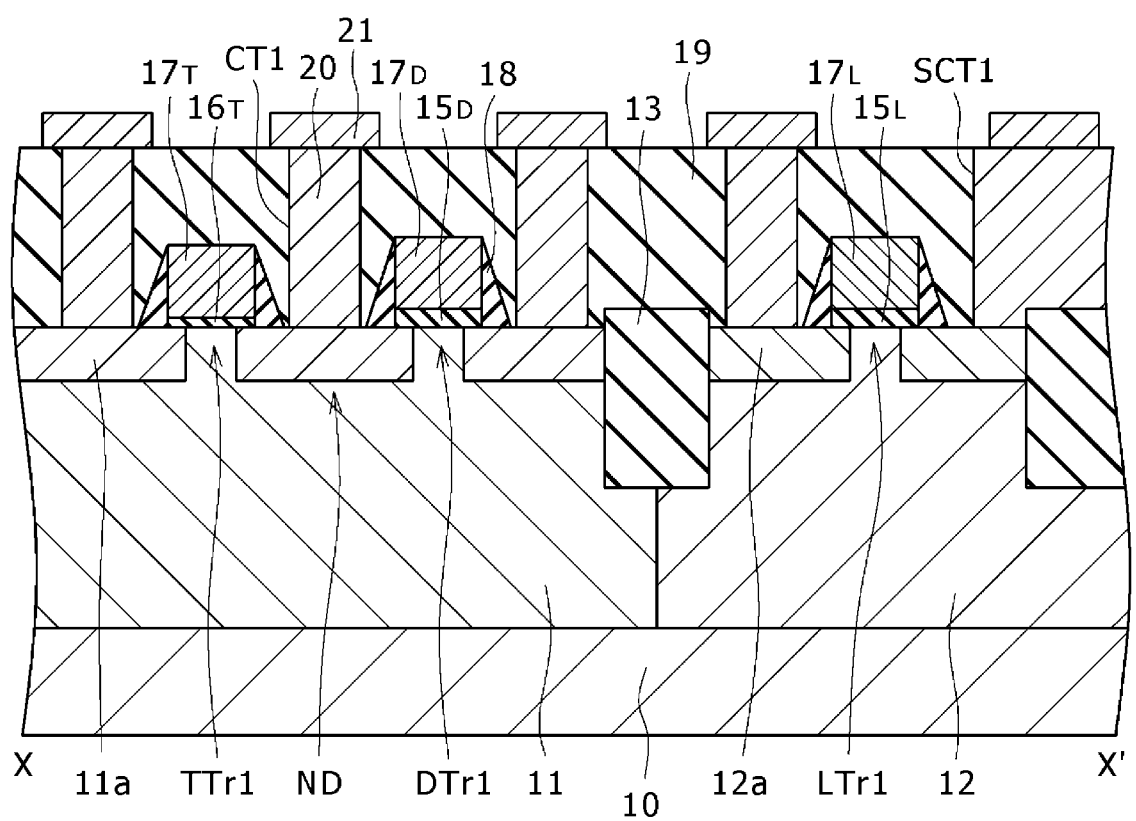
FIG. 3 is a sectional view along line X-X' in FIG. 2B.

FIG. 3 is a sectional view along line X-X' in FIG. 2B.

A P-type well 11 and an N-type well 12 are formed on a semiconductor substrate 10 and are isolated from each other by an element isolation insulating film 13.

Over the P-type well 11, a gate insulating film 16T and a gate electrode 17T of the first transfer transistor are formed, and sidewall spacers 18 are formed on both the sides thereof. Furthermore, a gate insulating film 15D and a gate electrode 17D of the first driver transistor are formed, and the sidewall spacers 18 are formed on both the sides thereof. N-type source/drain regions 11a are formed in the partial portions of the P-type well 11 on both the sides of the gate electrode 17T and on both the sides of the gate electrode 17D, so that the first transfer transistor TTr1 and the first driver transistor DTr1 are formed.

The source/drain region sandwiched between the gate electrode 17T and the gate electrode 17D serves as the first memory node ND.

Over the N-type well 12, a gate insulating film 15L and a gate electrode 17L of the first load transistor are formed, and the sidewall spacers 18 are formed on both the sides thereof. P-type source/drain regions 12a are formed in the partial portions of the N-type well 12 on both the sides of the gate electrode 17L, so that the first load transistor LTr1 is formed.

An interlayer insulating film 19 composed of e.g. silicon oxide is formed to cover the first transfer transistor TTr1, the first driver transistor DTr1, and the first load transistor LTr1. Contact holes that reach the source/drain regions of the respective transistors are opened, and an electrically-conductive layer 20 is buried in the contact holes, so that contacts such as the contact CT1 are formed. The contacts are connected to upper-layer interconnects 21. In particular, in the aperture arising from opening of the region ranging from the source/drain region of the first load transistor LTr1 to the third gate electrode G3 in a continuous manner, the common contact SCT1 connecting the third gate electrode G3 to the source/drain region of the first load transistor LTr1 is formed.

In the above-described structure, the gate insulating film 15D of the first driver transistor DTr1 and the gate insulating film 15L of the first load transistor LTr1 are designed to have a thickness larger than that of the gate insulating film 16T of the first transfer transistor TTr1.

Similarly, the gate insulating film of the second driver transistor DTr2 and the gate insulating film of the second load transistor LTr2 are designed to have a thickness larger than that of the gate insulating film of the second transfer transistor TTr2.

In the SRAM as the semiconductor memory device of the present embodiment, regarding the gate insulating films of six transistors included in the memory cell, the part to which a relatively-high voltage is applied during the standby state and thus across which leakage easily occurs in the standby state is designed to have a larger thickness, which makes it possible to reduce the standby leakage.

For example, if Vcs is 1.2 V and Vdd is 1.0 V, the thickness of the gate insulating films of the driver transistors and the load transistors is set to 1.8 nm, and the thickness of the gate insulating films of the transfer transistors is set to 1.4 nm in order to reduce the standby leakage.

A method for manufacturing a semiconductor memory device (SRAM) according to the present embodiment will be described below with reference to the drawings.

Figure 4A:
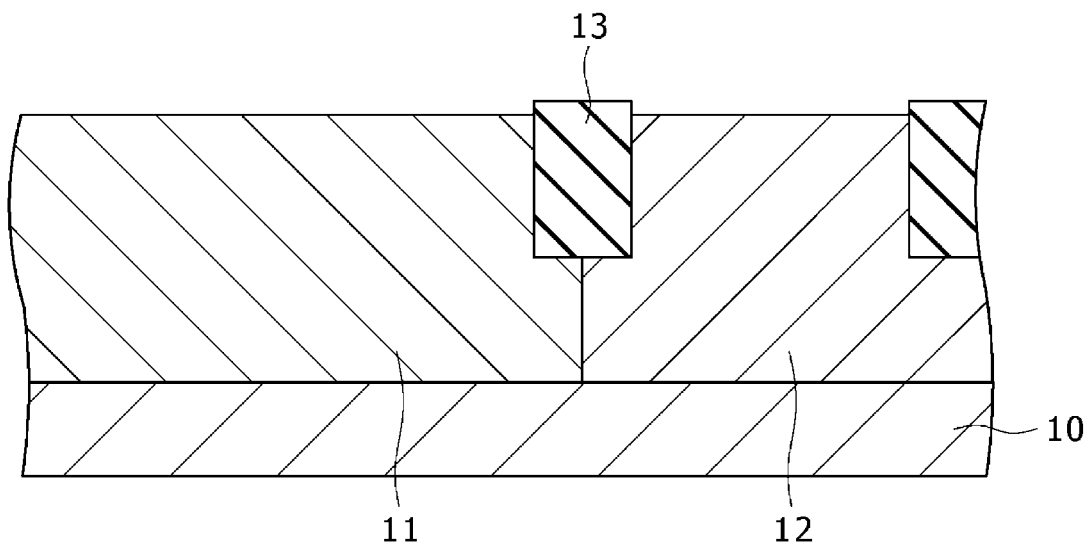
FIGS. 4A to 5B are sectional views showing manufacturing steps in a method for manufacturing a semiconductor memory device according to the first embodiment of the present invention.

Initially, as shown in FIG. 4A, the element isolation insulating film 13 by an STI (Shallow Trench Isolation) method and the P-type well 11 and the N-type well 12 isolated from each other by the insulating film 13 are formed over the semiconductor substrate 10.

Figure 4B:
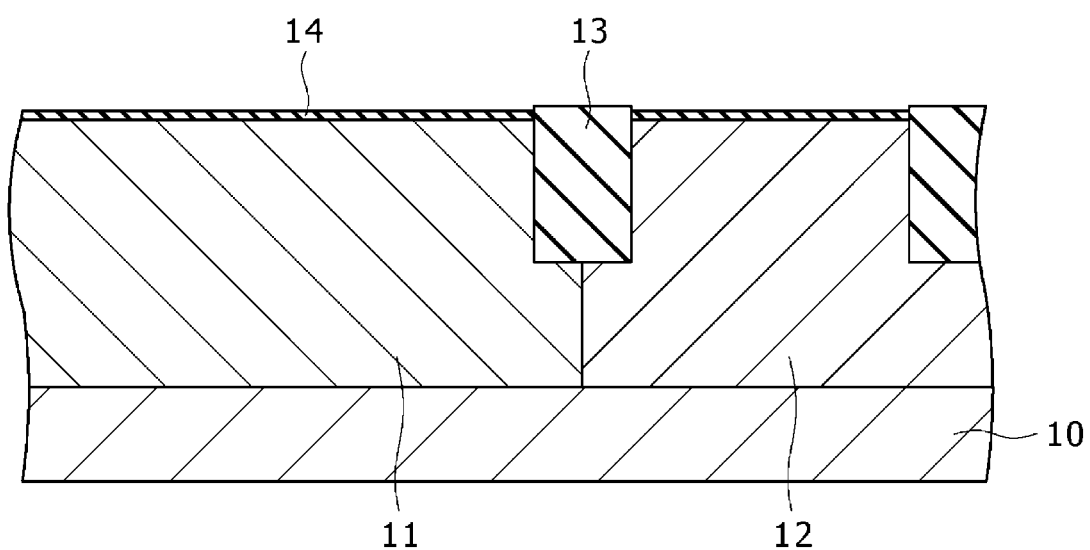

Subsequently, as shown in FIG. 4B, an oxide film 14 is formed on the surface of the P-type well 11 and the N-type well 12 by e.g. thermal oxidation or chemical vapor deposition (CVD).

Figure 5A:
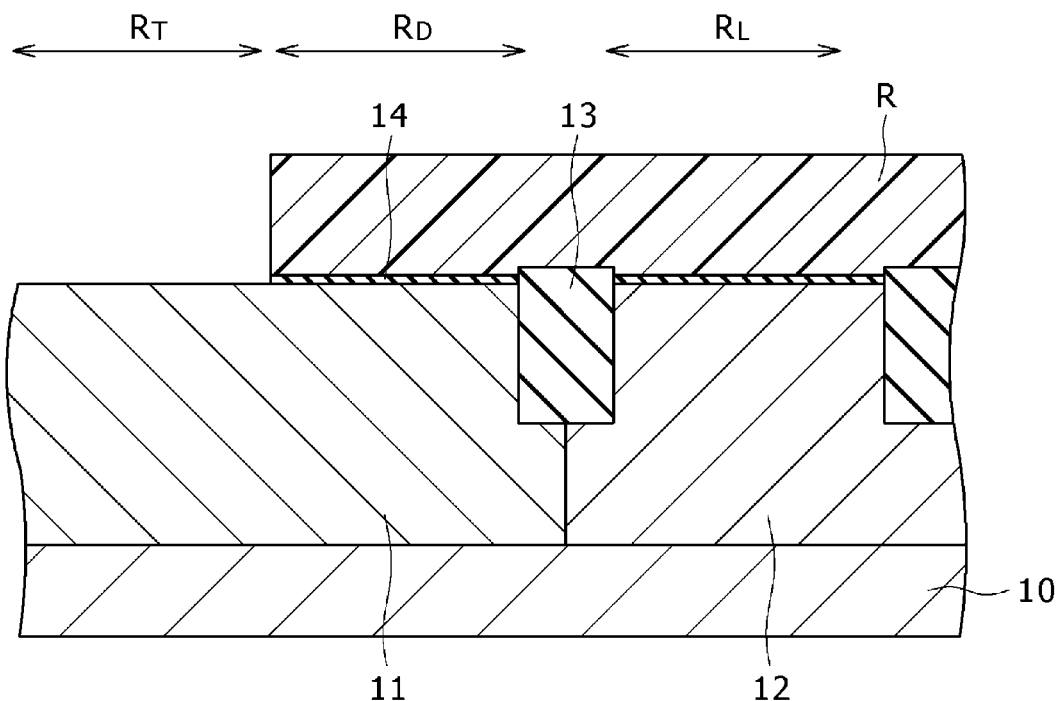

Subsequently, as shown in FIG. 5A, e.g. a resist film R that protects a driver transistor region $R_D$ and a load transistor region $R_L$ and allows the exposure of a transfer transistor region $R_T$ is formed, and then the oxide film 14 in the transfer transistor region $R_T$ is removed.

Figure 6:
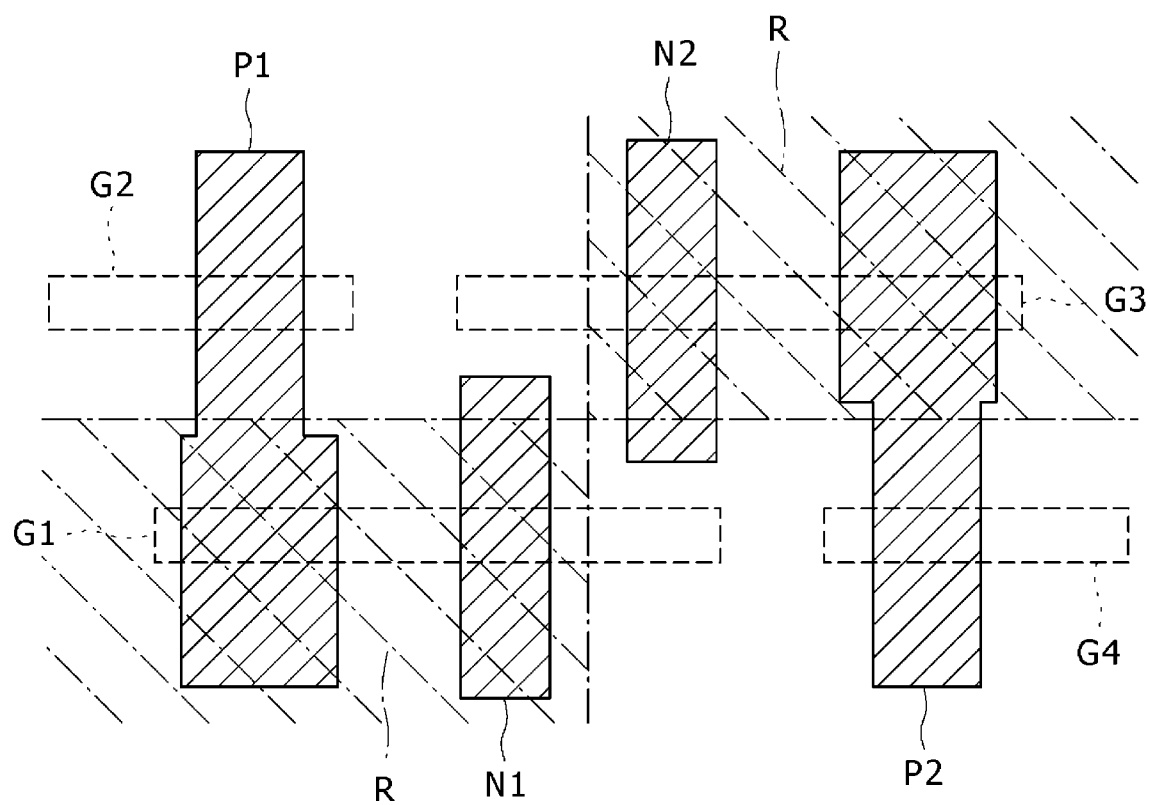
FIG. 6 is a plan view showing the formation pattern of a resist film in the manufacturing step according to the first embodiment of the present invention.

FIG. 6 is a plan view showing the formation pattern of the resist film R.

The resist film R has e.g. a pattern that allows the exposure of the part of the second gate electrode G2 and the fourth gate electrode G4 for the transfer transistors and protects the first gate electrode G1 and the third gate electrode G3 in the part in which the driver transistors and the load transistors are to be formed.

Figure 5B:
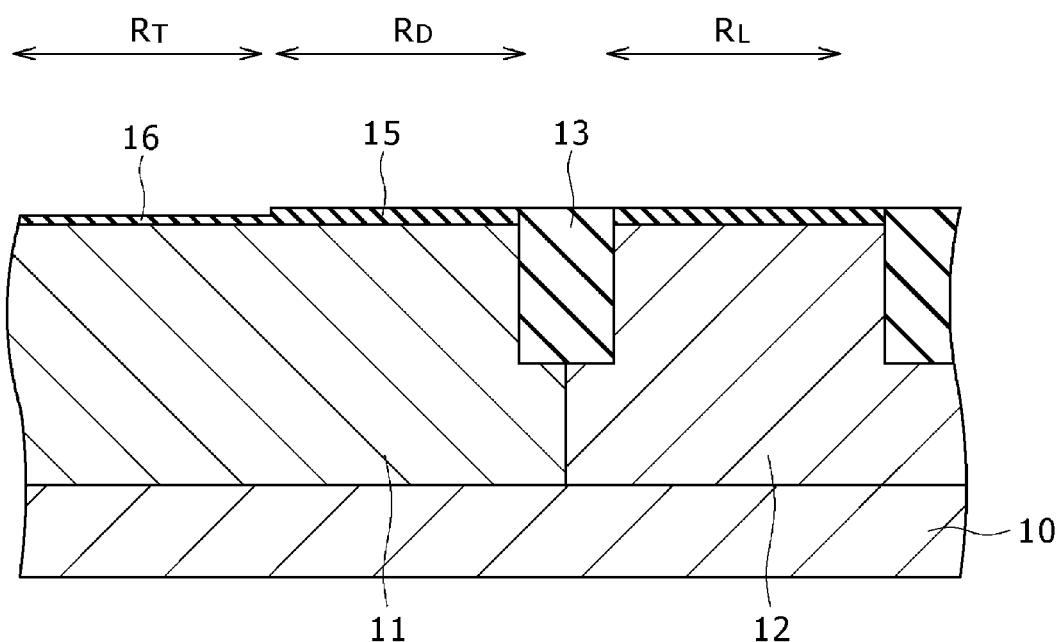

Subsequently, as shown in FIG. 5B, the resist film R is removed by e.g. ashing treatment, and then the thickness of the oxide film 14 in the driver transistor region $R_D$ and the load transistor region $R_L$ is increased by thermal oxidation or chemical vapor deposition (CVD), so that a gate insulating film 15 is formed in these regions. In the transfer transistor region $R_T$, a gate insulating film 16 that is for the transfer transistors and is thinner than the gate insulating film 15 is formed.

In this manner, the gate insulating film of the first driver transistor DTr1, the gate insulating film of the second driver transistor DTr2, the gate insulating film of the first load transistor LTr1, and the gate insulating film of the second load transistor LTr2, including the memory-node-side end of the gate insulating film of the first driver transistor DTr1, the memory-node-side end of the gate insulating film of the second driver transistor DTr2, the memory-node-side end of the gate insulating film of the first load transistor LTr1, and the memory-node-side end of the gate insulating film of the second load transistor LTr2, are increased in thickness through plural times of oxide film forming treatment such as thermal oxidation treatment or CVD treatment. On the other hand, the gate insulating film of the first transfer transistor TTr1 and the gate insulating film of the second transfer transistor TTr2 are so formed as to have a smaller thickness through only one time of oxide film forming treatment.

Figure 7A:
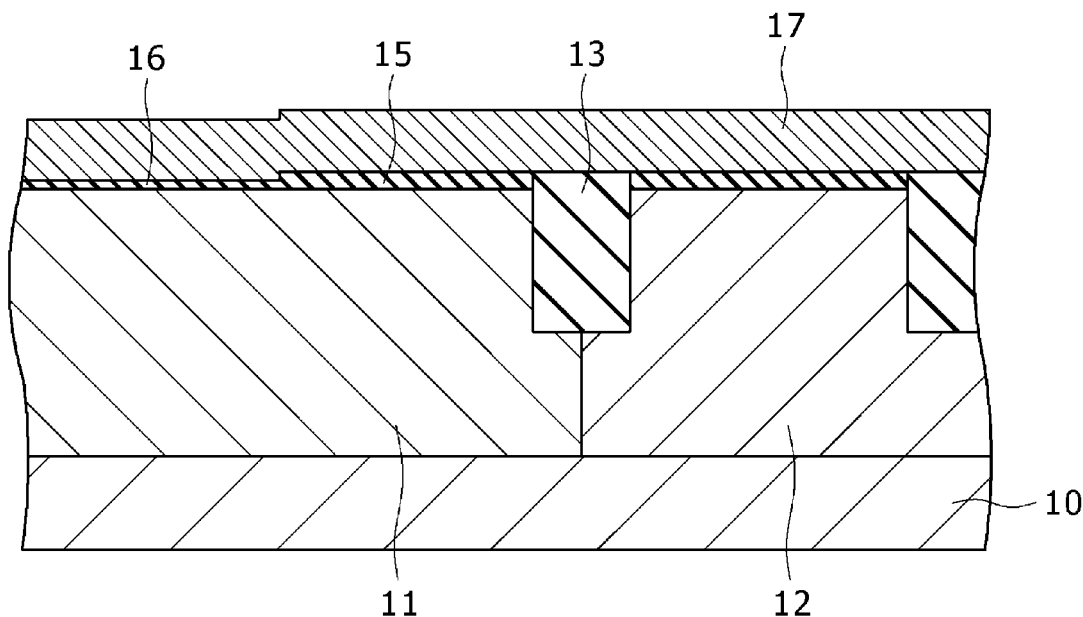
FIGS. 7A to 8B are sectional views showing manufacturing steps in the method for manufacturing a semiconductor memory device according to the first embodiment of the present invention.

Subsequently, as shown in FIG. 7A, an electrically-conductive layer 17 is formed e.g. by depositing poly-silicon across the entire surface by CVD.

Figure 7B:
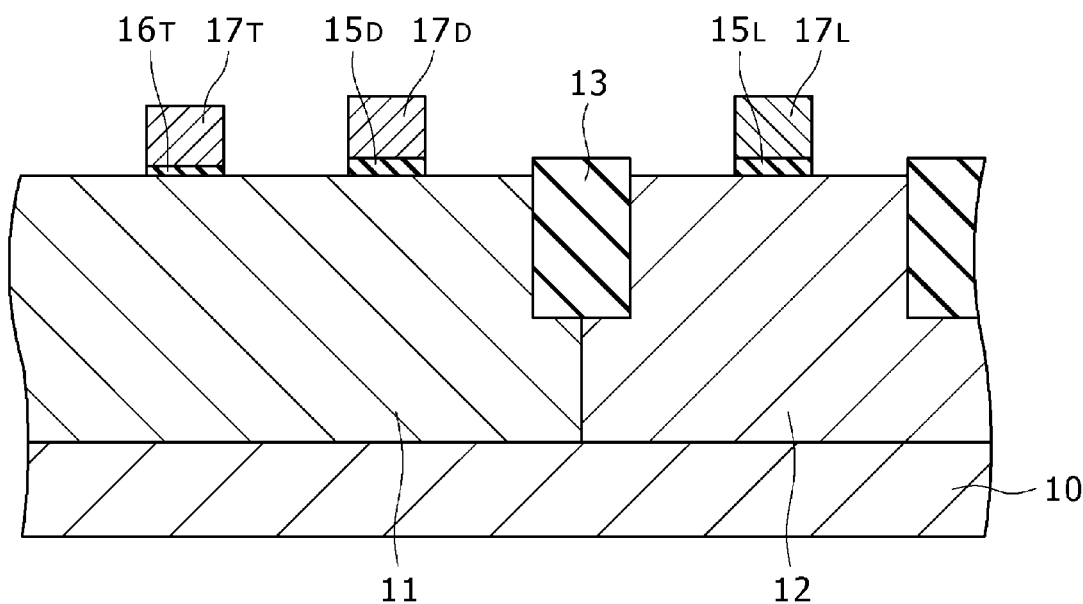

Subsequently, as shown in FIG. 7B, e.g. a resist film (not shown) for protection with the pattern of the gate electrodes of the respective transistors is formed, and etching treatment is performed to thereby pattern-process the conductive layer 17 and the gate insulating films 15 and 16. Thereby, the gate insulating film 16T and the gate electrode 17T of the transfer transistor, the gate insulating film 15D and the gate electrode 17D of the driver transistor, and the gate insulating film 15L and the gate electrode 17L of the load transistor are formed.

Figure 8A:
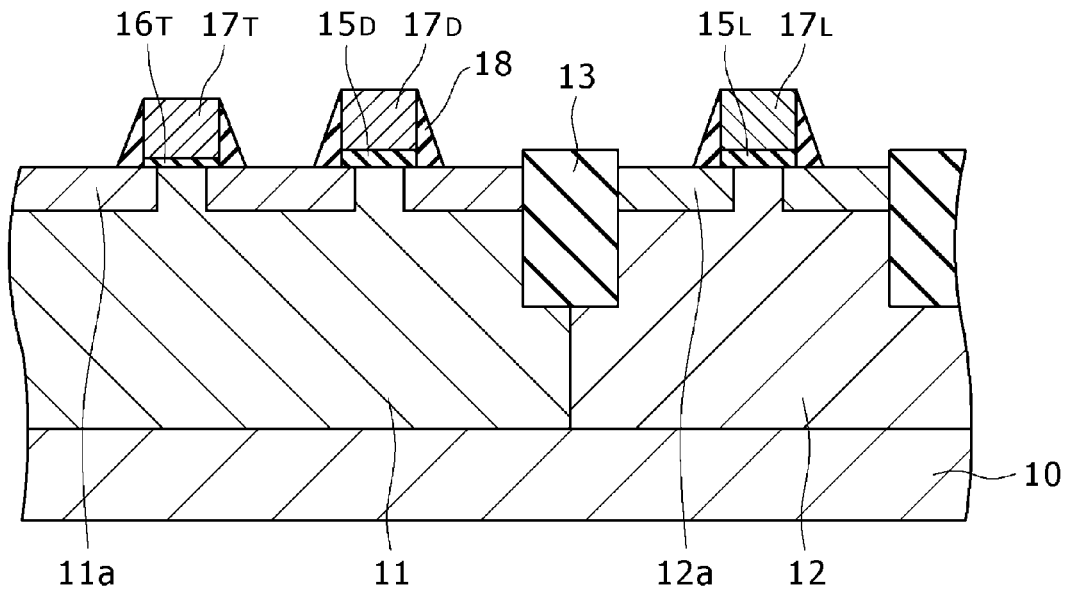

Subsequently, as shown in FIG. 8A, e.g. by depositing silicon nitride across the entire surface by CVD and performing etch back and so on, the sidewall spacers 18 are formed on both the sides of the gate electrode 17T, the gate electrode 17D, and the gate electrode 17L. Subsequently, by ion implantation, the N-type source/drain regions 11a are formed in the partial portions of the P-type well 11 on both the sides of the gate electrode 17T and the gate electrode 17D. Furthermore, by ion implantation, the P-type source/drain regions 12a are formed in the partial portions of the N-type well 12 on both the sides of the gate electrode 17L.

It is also possible to form the source/drain regions each having an extension region by performing ion implantation before and after the formation of the sidewall spacers.

In this way, the memory cell having the transfer transistors, the driver transistors, and the load transistors can be formed.

Figure 8B:
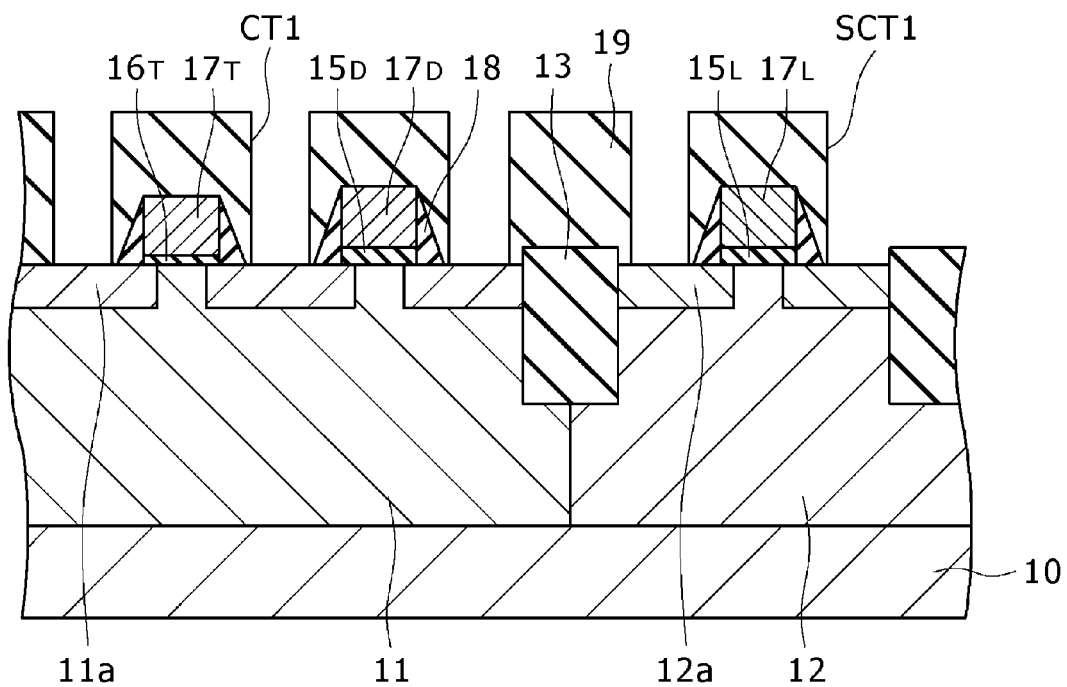

Subsequently, as shown in FIG. 8B, the interlayer insulating film 19 is formed e.g. by depositing silicon oxide across the entire surface by CVD, and contact holes that reach the source/drain regions of the respective transistors are opened. In particular, the region ranging from the source/drain region of the first load transistor LTr1 to the third gate electrode G3 is opened in a continuous manner.

In the subsequent step, e.g. the conductive layer 20 is buried in the respective contact holes. In the aperture arising from the opening of the region ranging from the source/drain region of the first load transistor LTr1 to the third gate electrode G3, the common contact SCT1 connecting the third gate electrode G3 to the source/drain region of the first load transistor LTr1 is formed. Subsequently, the pattern of the upper-layer interconnects 21 is formed on the contacts, so that the semiconductor memory device having the structure shown in FIG. 3 can be manufactured.

In the method for manufacturing a semiconductor memory device according to the present embodiment, the gate insulating films of six transistors included in the memory cell are manufactured in such a way that the part to which a relatively-high voltage is applied during the standby state and thus across which leakage easily occurs in the standby state has a larger thickness, which makes it possible to manufacture a semiconductor memory device that allows reduced standby leakage.

Modification Example

Figures 9A, 9B:
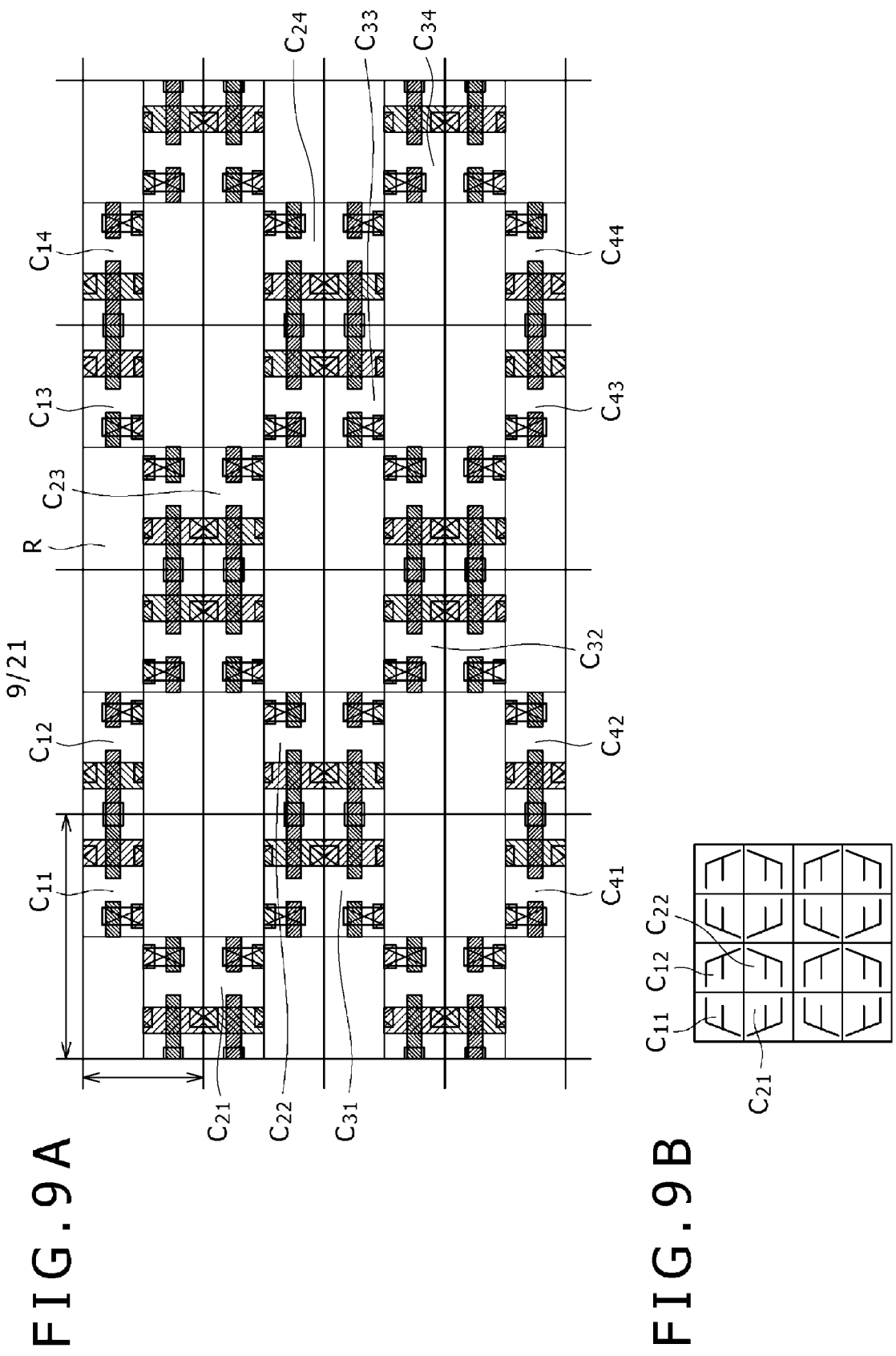
FIG. 9A is a plan view showing a resist film pattern in which adjacent memory cells are coupled with each other, of the resist film shown in FIG. 5A.
FIG. 9B is a schematic diagram showing the layout of a memory cell.

In the above-described method for manufacturing a semiconductor memory device, it is possible to treat the following four memory cells whose layout is shown in FIG. 9B as one group: a memory cell $C_{11}$; a memory cell $C_{12}$ having the pattern of horizontal line symmetry with respect to the memory cell $C_{11}$; a memory cell $C_{21}$ having the pattern of vertical line symmetry with respect to the memory cell $C_{11}$;

and a memory cell $C_{22}$ having the pattern of rotational symmetry with respect to the memory cell $C_{11}$.

In this case, as the formation pattern of the resist film R like that shown in FIG. 5A, which protects the driver transistor region $R_D$ and the load transistor region $R_L$ and allows the exposure of the transfer transistor region $R_T$, a resist film pattern in which adjacent memory cells are coupled with each other can be employed as shown in FIG. 9A, which shows the memory cells $C_{11}$ to $C_{44}$. This offers an advantage of facilitating the patterning.

Second Embodiment

Figure 10:
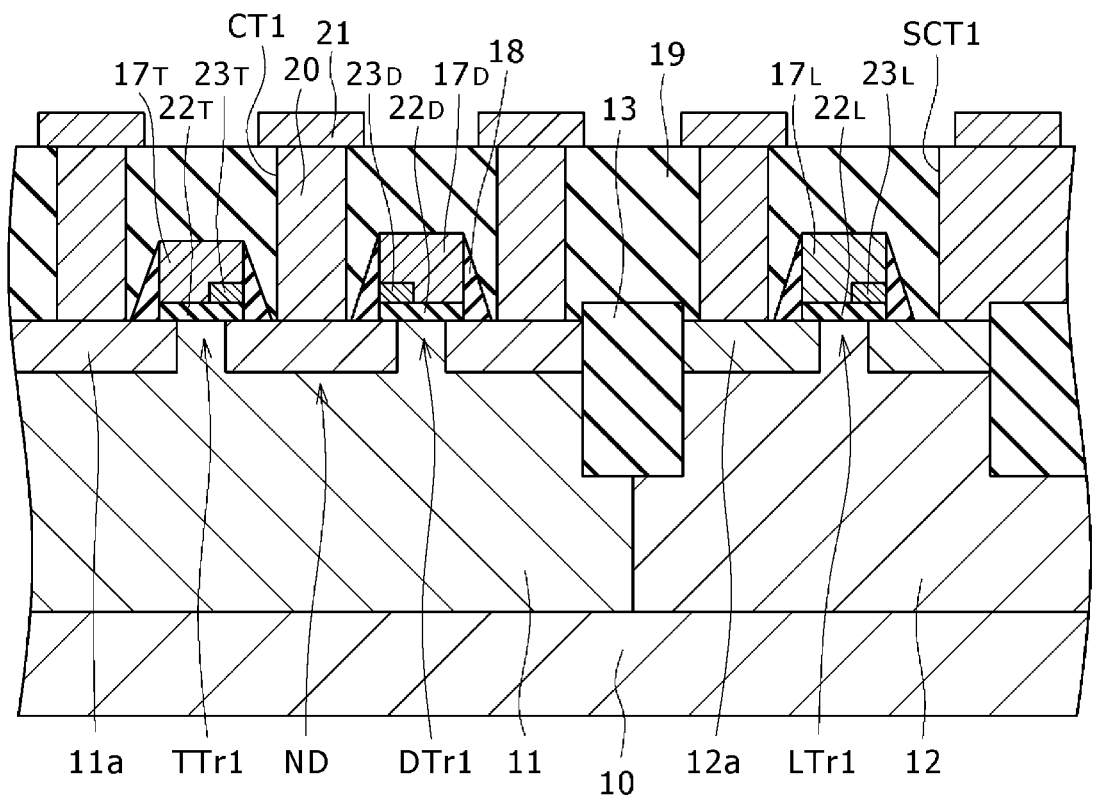
FIG. 10 is a sectional view of an SRAM as a semiconductor memory device according to a second embodiment of the present invention.

FIG. 10 is a sectional view of a memory cell in an SRAM according to a second embodiment of the present invention, and is equivalent to the sectional view along line X-X' in FIG. 2B for the first embodiment.

Similarly to the first embodiment, at least the memory-node-side end of the gate insulating film of the first driver transistor DTr1, the memory-node-side end of the gate insulating film of the second driver transistor DTr2, the memory-node-side end of the gate insulating film of the first load transistor LTr1, and the memory-node-side end of the gate insulating film of the second load transistor LTr2 have a thickness larger than that of the gate insulating film of the other part. In the present embodiment, for example, in each of the first driver transistor DTr1, the second driver transistor DTr2, the first load transistor LTr1, the second load transistor LTr2, the first transfer transistor TTr1, and the second transfer transistor TTr2, the memory-node-side end of the gate insulating film has a thickness larger than that of the other part.

Except for this feature, the second embodiment is substantially the same as the first embodiment.

In the semiconductor memory device of the present embodiment, regarding the gate insulating films of six transistors included in the memory cell, the part to which a relatively-high voltage is applied during the standby state and thus across which leakage easily occurs in the standby state is designed to have a larger thickness, which makes it possible to reduce the standby leakage.

For example, if Vcs is 1.2 V and Vdd is 1.0 V, the thickness of the node-side ends of the gate insulating films of the driver transistors, the load transistors, and the transfer transistors is set to 1.8 nm, and the thickness of the gate insulating films of the other part is set to 1.4 nm in order to reduce the standby leakage.

A method for manufacturing a semiconductor memory device (SRAM) according to the present embodiment will be described below with reference to the drawings.

Figure 11A:
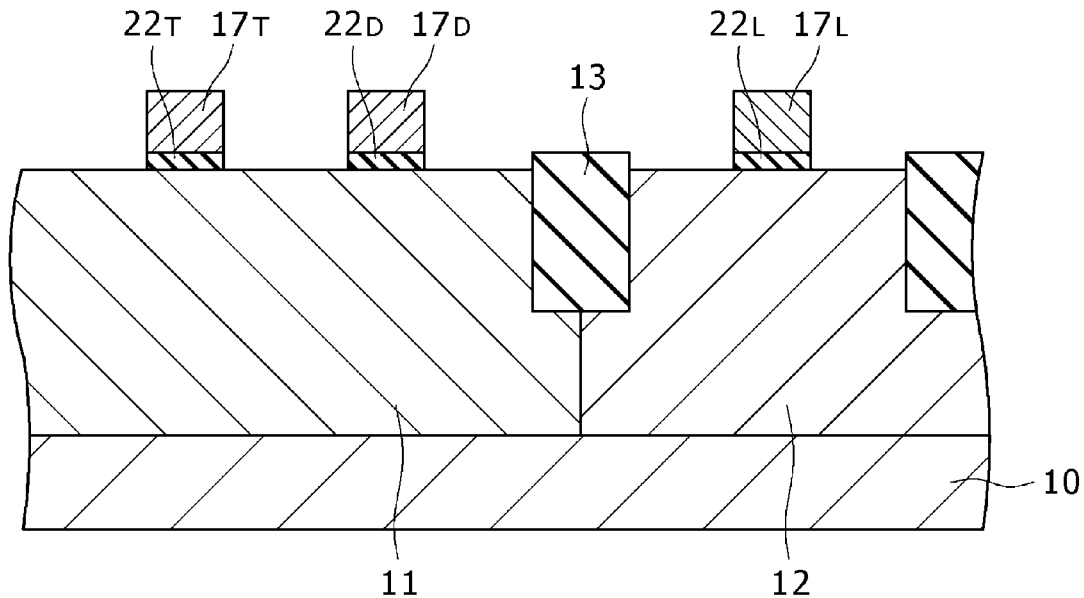
FIGS. 11A and 11B are sectional views showing manufacturing steps in a method for manufacturing a semiconductor memory device according to the second embodiment of the present invention.

Initially, the process until the step of processing the pattern of the gate electrodes shown in FIG. 11A is carried out in a manner similar to that of the first embodiment. However, the gate insulating films of all of the driver transistor, the load transistor, and the transfer transistor are formed to have the same thickness.

Specifically, a gate insulating film and a conductive layer composed of e.g. poly-silicon are formed and processed into the pattern of the gate electrodes, so that a gate insulating film 22T and the gate electrode 17T of the transfer transistor, a gate insulating film 22D and the gate electrode 17D of the driver transistor, and a gate insulating film 22L and the gate electrode 17L of the load transistor are formed.

Figure 11B:
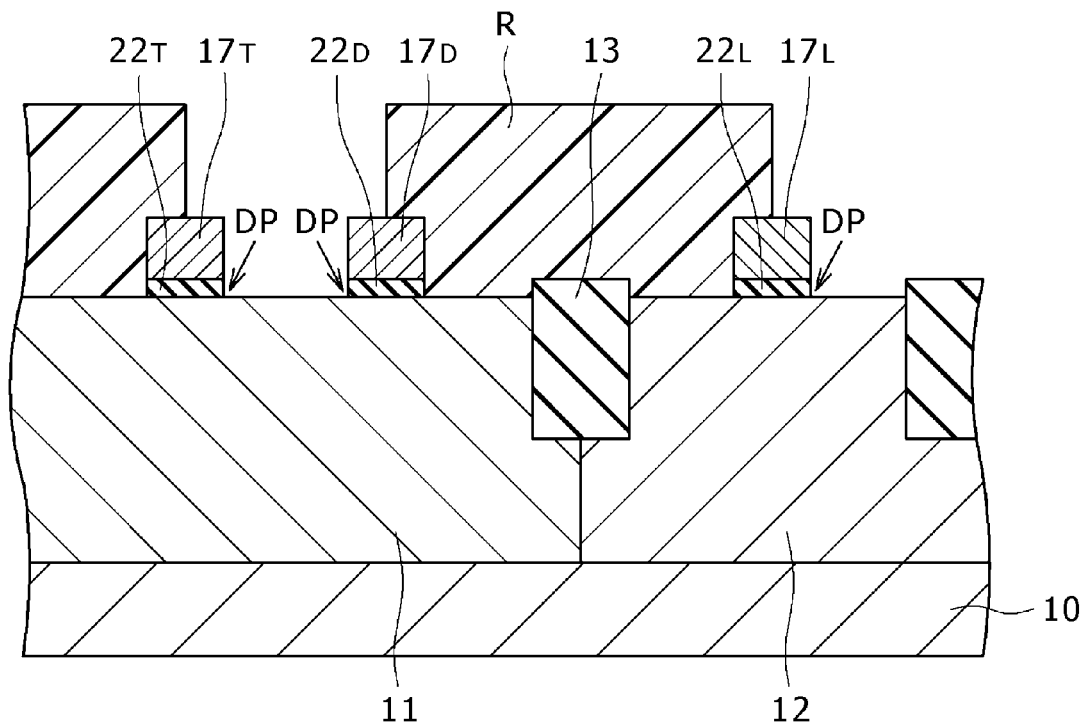

Subsequently, as shown in FIG. 11B, e.g. a resist film R is formed that has such a pattern as to expose the memory-node-side end of the gate electrode of each of the driver transistor, the load transistor, and the transfer transistor.

Subsequently, in the gate insulating films under the gate electrodes of the exposed area, an impurity DP such as P, As, or Ge is introduced by oblique ion implantation.

Figure 12:
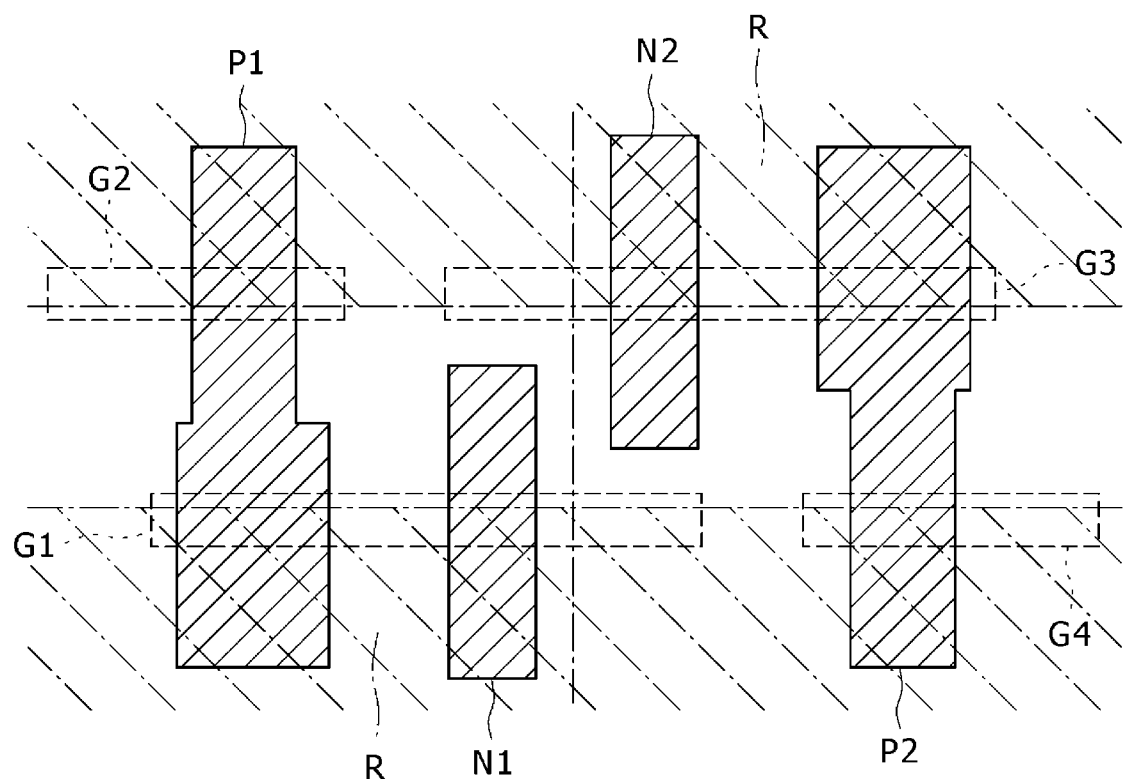
FIG. 12 is a plan view showing the formation pattern of a resist film in the manufacturing step according to the second embodiment of the present invention.

FIG. 12 is a plan view showing the formation pattern of the resist film R.

The resist film R has e.g. a pattern that allows the exposure of the area between the first gate electrode G1 in the part in which the driver transistor and the load transistor are to be formed and the second gate electrode G2 for the transfer transistor, and the area between the third gate electrode G3 and the fourth gate electrode G4.

Figure 13A:
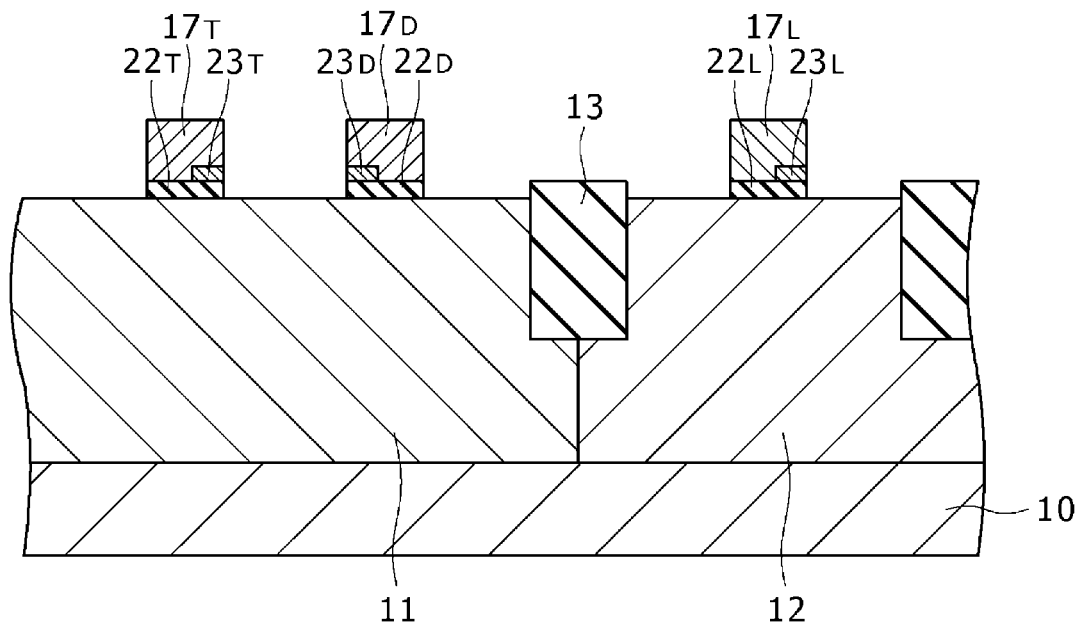
FIGS. 13A and 13B are sectional views showing manufacturing steps in the method for manufacturing a semiconductor memory device according to the second embodiment of the present invention.

Subsequently, as shown in FIG. 13A, the resist film R is removed by e.g. ashing treatment, and then oxidation of side surfaces of the gates is performed. As a result, due to the occurrence of enhanced oxidation in the parts into which the ions are implanted in the above-described step, large-thickness parts 23D, 23L, and 23T are formed for the driver transistor, the load transistor, and the transfer transistor, respectively, which allows the memory-node-side ends to be increased in thickness compared with the other part.

Figure 13B:
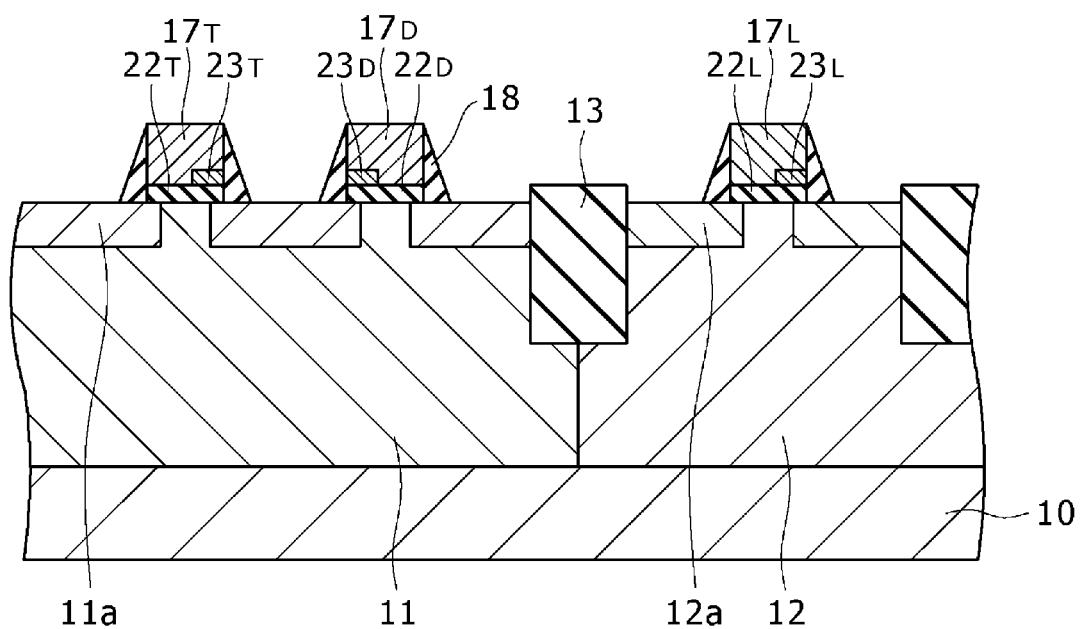

Subsequently, as shown in FIG. 13B, e.g. by depositing silicon nitride across the entire surface by CVD and performing etch back and so on, the sidewall spacers 18 are formed on both the sides of the gate electrode 17T, the gate electrode 17D, and the gate electrode 17L. Subsequently, by ion implantation, the N-type source/drain regions 11a are formed in the partial portions of the P-type well 11 on both the sides of the gate electrode 17T and the gate electrode 17D. Furthermore, by ion implantation, the P-type source/drain regions 12a are formed in the partial portions of the N-type well 12 on both the sides of the gate electrode 17L.

It is also possible to form the source/drain regions each having an extension region by performing ion implantation before and after the formation of the sidewall spacers.

The subsequent steps are carried out similarly to the first embodiment, so that the semiconductor memory device having the structure shown in FIG. 10 can be manufactured.

In the method for manufacturing a semiconductor memory device according to the present embodiment, the gate insulating films of six transistors included in the memory cell are manufactured in such a way that the part to which a relatively-high voltage is applied during the standby state and thus across which leakage easily occurs in the standby state has a larger thickness, which makes it possible to manufacture a semiconductor memory device that allows reduced standby leakage.

Modification Example

Figure 14:
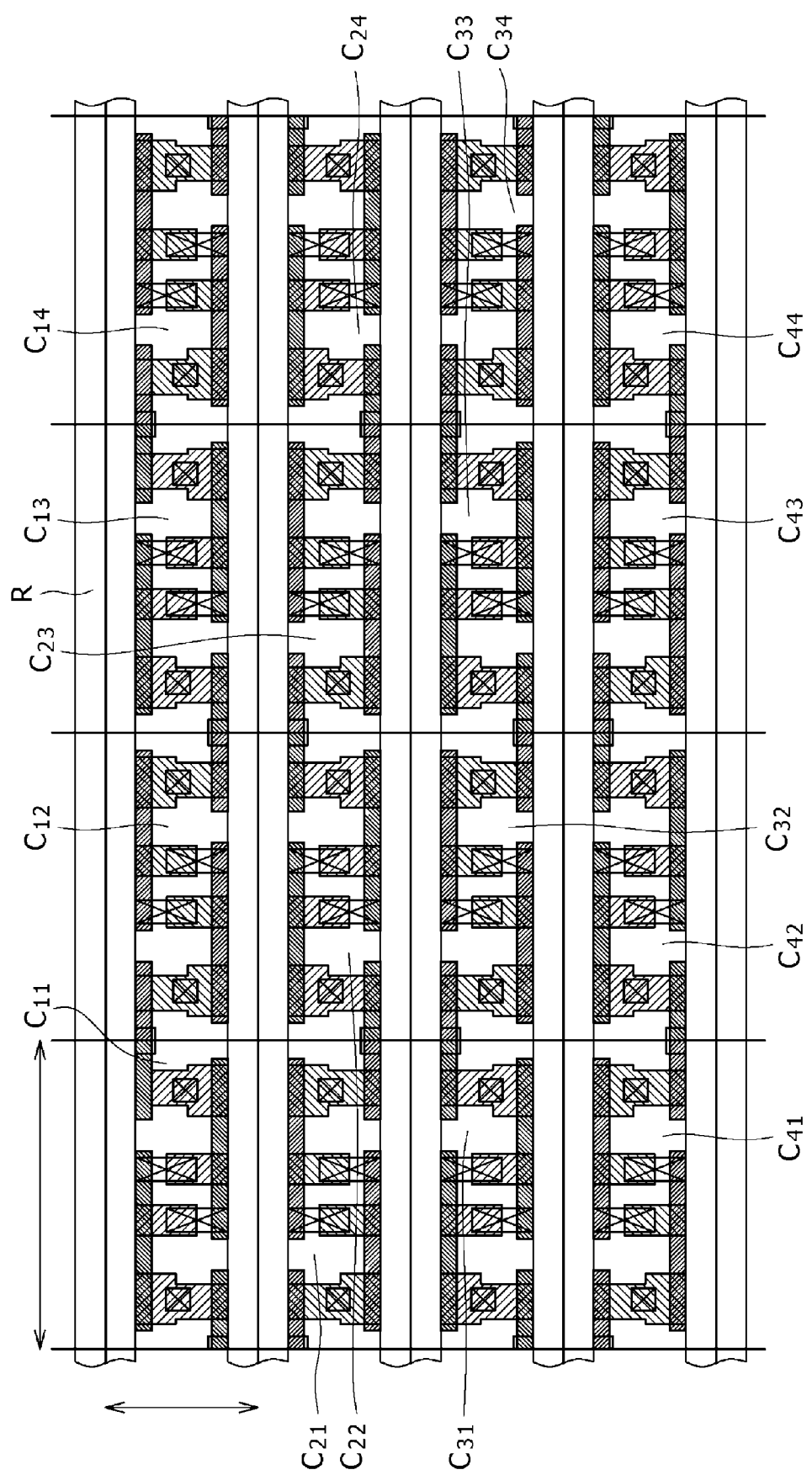
FIG. 14 is a plan view showing a resist film pattern in which adjacent memory cells are coupled with each other, of the resist film shown in FIG. 11B.

As the above-described resist film having a pattern that allows the exposure of the area between the first gate electrode G1 in the part in which the driver transistor and the load transistor are to be formed and the second gate electrode G2 of the transfer transistor, and the area between the third gate electrode G3 and the fourth gate electrode G4, a resist film can be formed that has a pattern in which adjacent memory cells are coupled with each other as shown in FIG. 14, which shows the memory cells $C_{11}$ to $C_{44}$.

Third Embodiment

The semiconductor memory device according to the second embodiment can be manufactured also by the following manufacturing method.

Figure 15A:
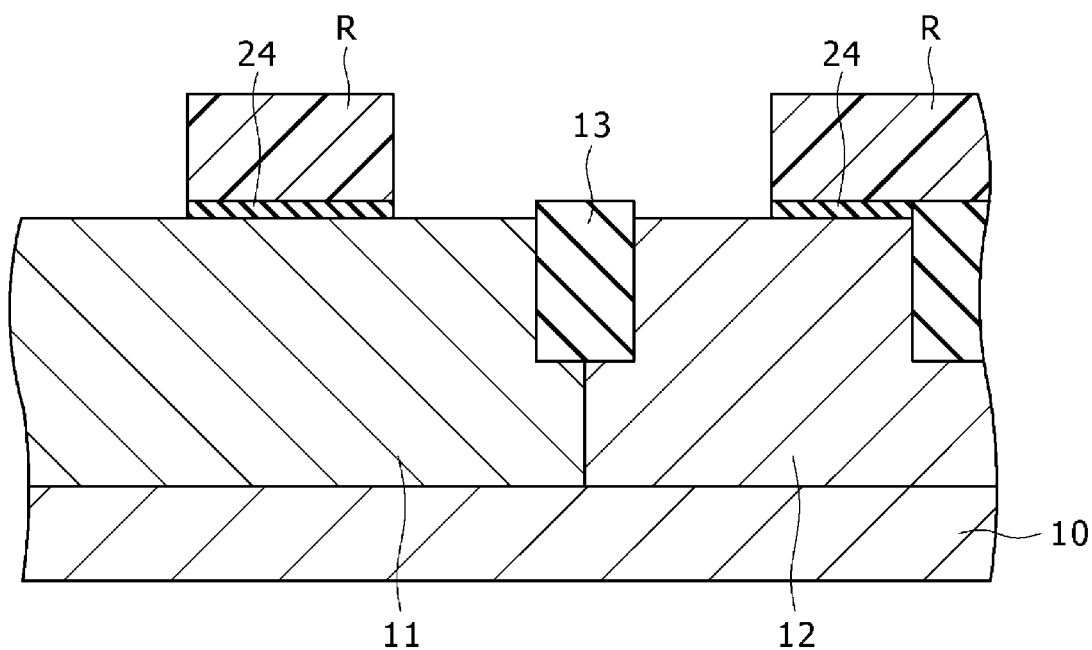
FIGS. 15A and 15B are sectional views showing manufacturing steps in a method for manufacturing a semiconductor memory device according to a third embodiment of the present invention.

Initially, the process until the step shown in FIG. 15A can be carried out in a manner similar to that of the first embodiment.

Specifically, similarly to the first embodiment, an oxide film 24 is formed across the entire area of the driver transistor, the load transistor, and the transfer transistor by thermal oxidation or CVD. Subsequently, a resist film R is formed that has such a pattern as to leave the memory-node-side ends of the driver transistor, the load transistor, and the transfer transistor, which are to have a larger thickness, followed by etch-removal of the oxide film 24.

Figure 16:
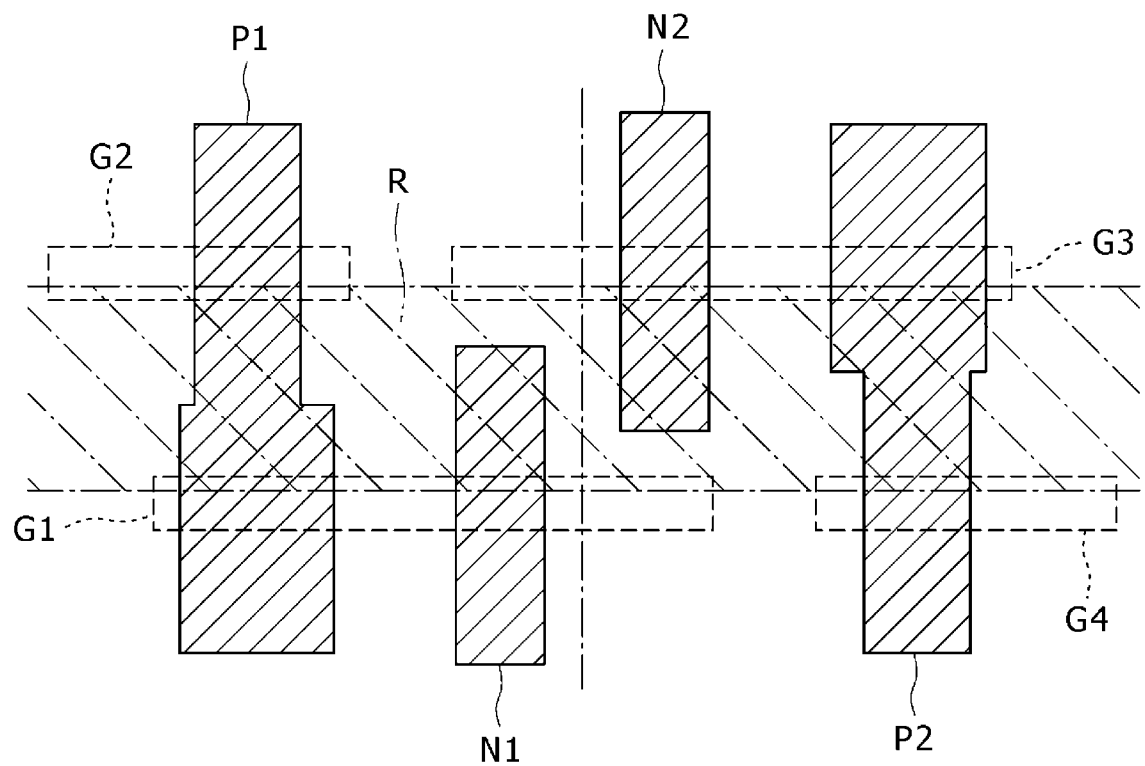
FIG. 16 is a plan view showing the formation pattern of a resist film in the manufacturing step according to the third embodiment of the present invention.

FIG. 16 is a plan view showing the formation pattern of the resist film R.

As the pattern for protecting the area corresponding to the memory-node-side ends of the driver transistors, the load transistors, and the transfer transistors, e.g. such a pattern that the resist film R overlaps the memory-node-side ends of the first to fourth gate electrodes G1 to G4 is employed.

Figure 15B:
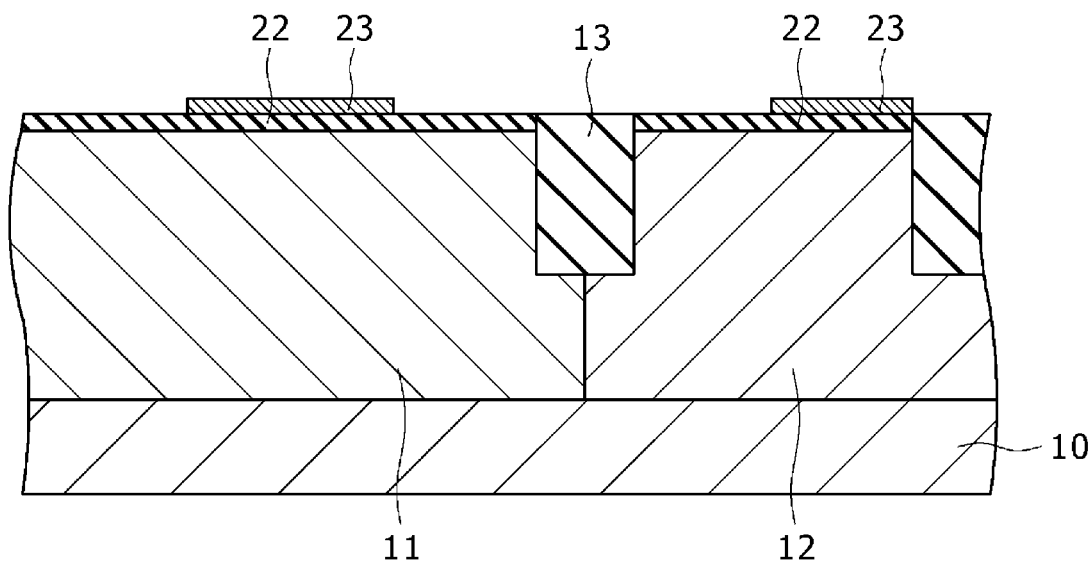

Subsequently, as shown in FIG. 15B, the resist film R is removed, and then thermal oxidation or CVD is so performed as to obtain the state in which a gate insulating film 22 and a large-thickness part 23 are formed for each of the memory-node-side ends of the driver transistor, the load transistor, and the transfer transistor, while only the gate insulating film 22 is formed for the remaining part.

The above-described steps allow the formation of the configuration in which the memory-node-side end of the gate insulating film of the driver transistor, the memory-node-side end of the gate insulating film of the load transistor, and the memory-node-side end of the gate insulating film of the transfer transistor have a larger thickness due to plural times of oxide film forming treatment such as thermal oxidation treatment or CVD treatment, while the remaining part has a smaller thickness due to only one time of oxide film forming treatment.

Figure 17A:
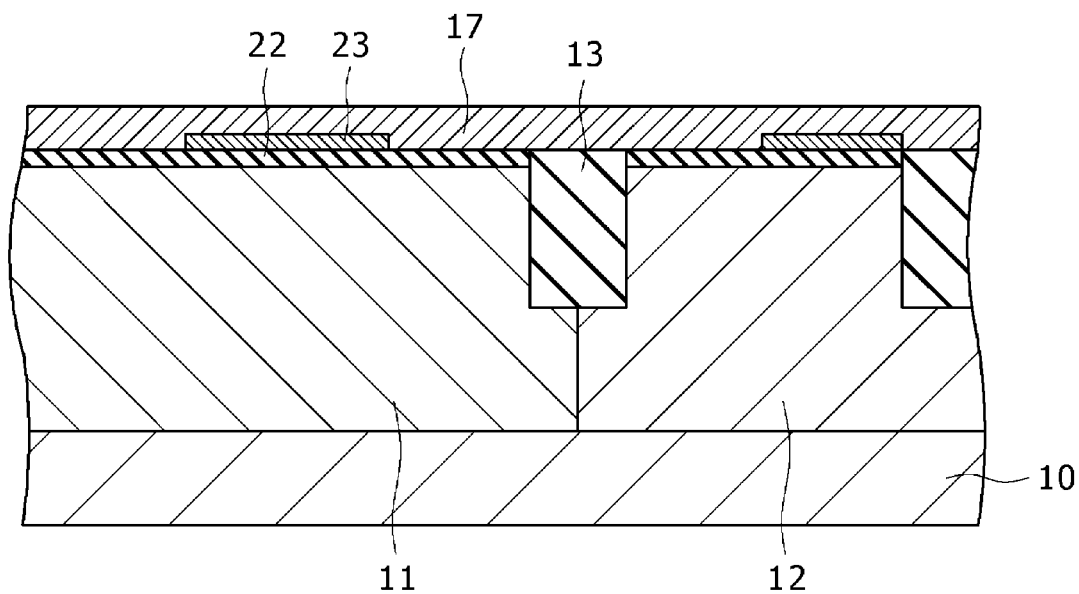
FIGS. 17A and 17B are sectional views showing manufacturing steps in the method for manufacturing a semiconductor memory device according to the third embodiment of the present invention.

Subsequently, as shown in FIG. 17A, an electrically-conductive layer 17 is formed e.g. by depositing poly-silicon across the entire surface by CVD.

Figure 17B:
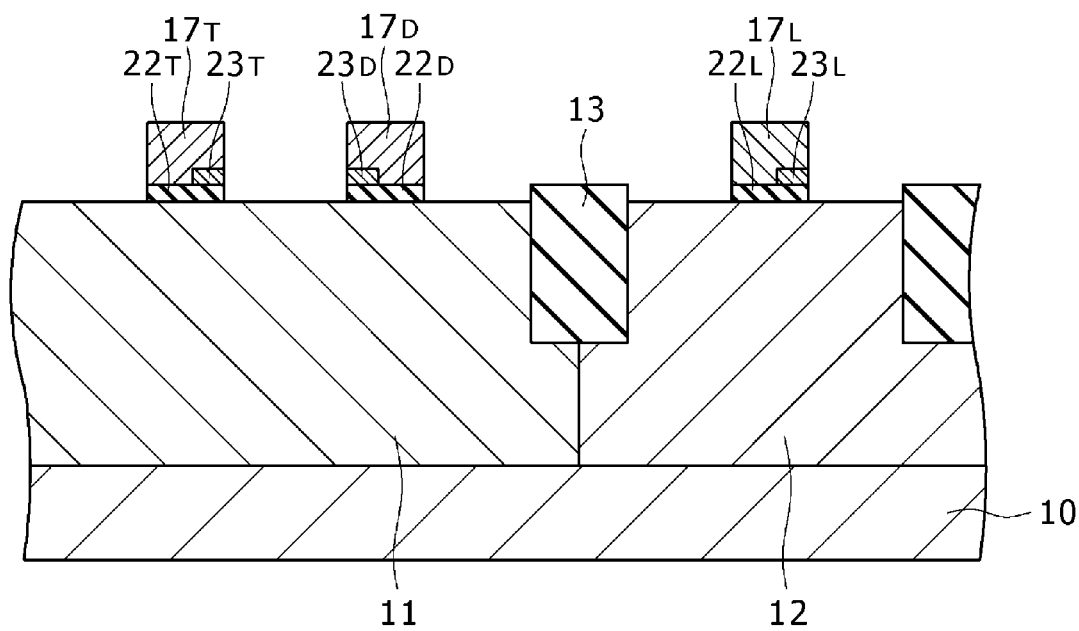

Subsequently, as shown in FIG. 17B, e.g. a resist film (not shown) for protection with the pattern of the gate electrodes of the respective transistors is formed, and then etching treatment is performed to thereby pattern-process the conductive layer 17, the gate insulating film 22, and the large-thickness part 23.

In this manner, the large-thickness parts 23D, 23L, and 23T are formed for the driver transistor, the load transistor, and the transfer transistor, respectively, which allows the memory-node-side ends to be increased in thickness compared with the other part.

The subsequent steps are carried out similarly to the first embodiment, so that the semiconductor memory device having the structure shown in FIG. 10 can be manufactured.

In the method for manufacturing a semiconductor memory device according to the present embodiment, the gate insulating films of six transistors included in the memory cell are manufactured in such a way that the part to which a relatively-high voltage is applied during the standby state and thus across which leakage easily occurs in the standby state has a larger thickness, which makes it possible to manufacture a semiconductor memory device that allows reduced standby leakage.

Modification Example

Figure 18:
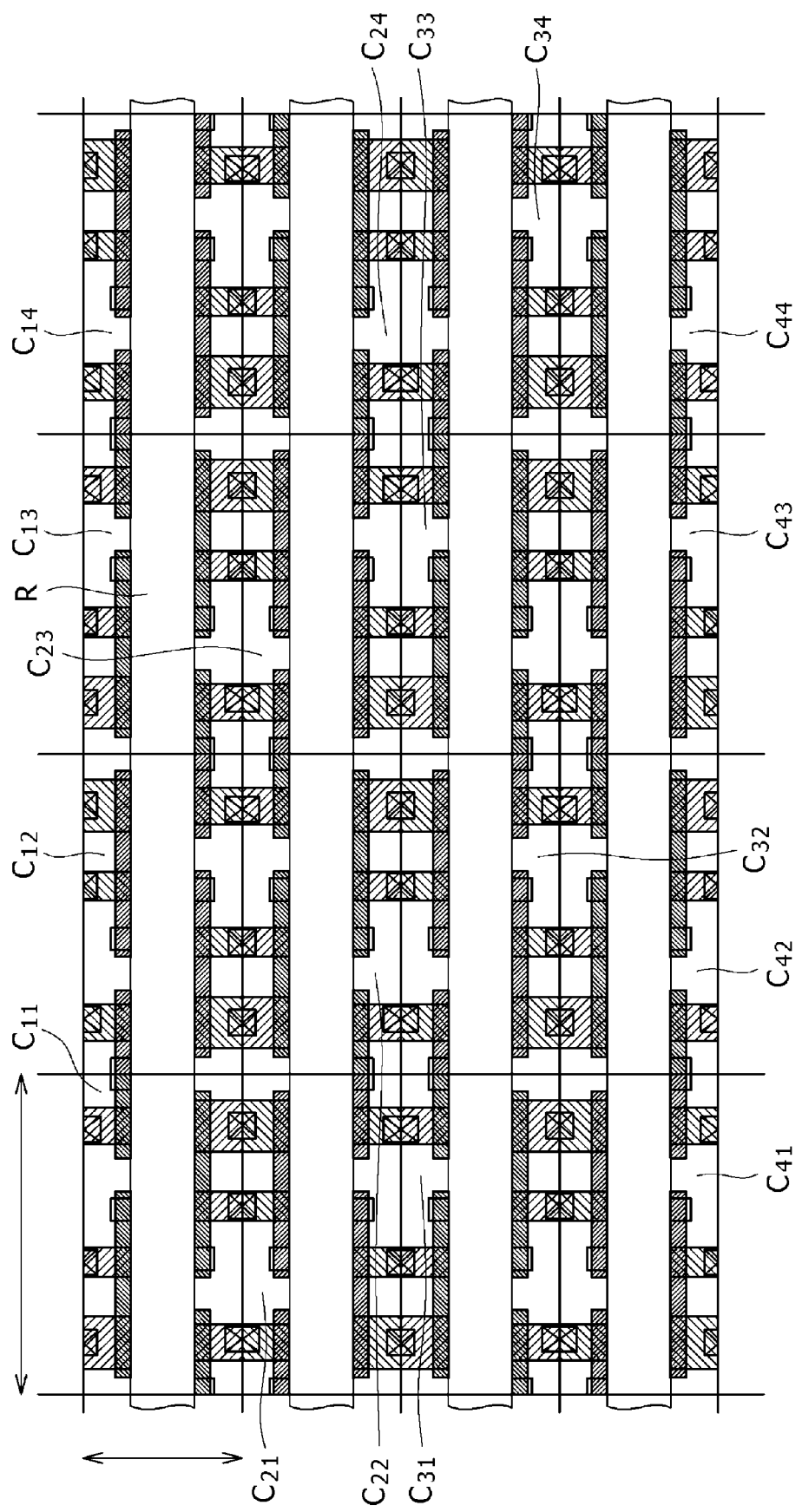
FIG. 18 is a plan view showing a resist film pattern in which adjacent memory cells are coupled with each other, of the resist film shown in FIG. 15A.

As the above-described resist film having such a pattern as to overlap the memory-node-side ends of the first to fourth gate electrodes G1 to G4, a resist film can be formed that has a pattern in which adjacent memory cells are coupled with each other as shown in FIG. 18, which shows the memory cells $C_{11}$ to $C_{44}$.

Fourth Embodiment

Figure 19:
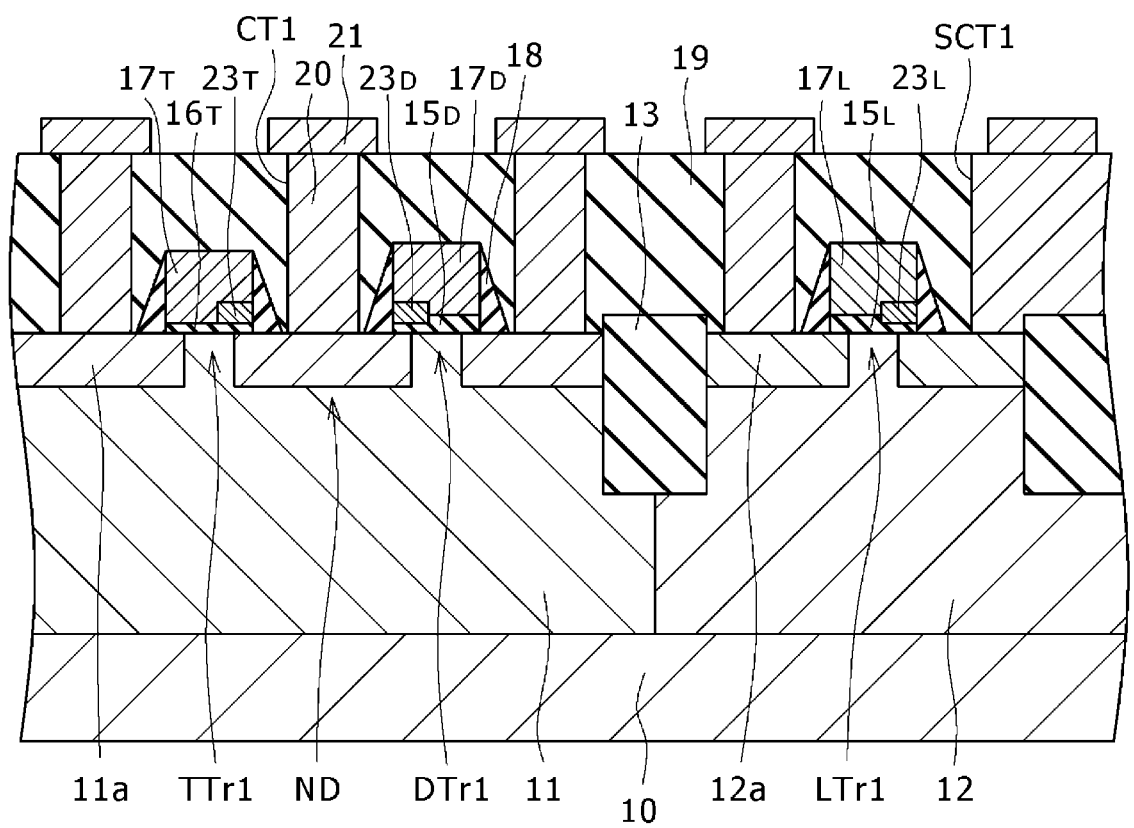
FIG. 19 is a sectional view of an SRAM as a semiconductor memory device according to a fourth embodiment of the present invention.
Figure 20A:
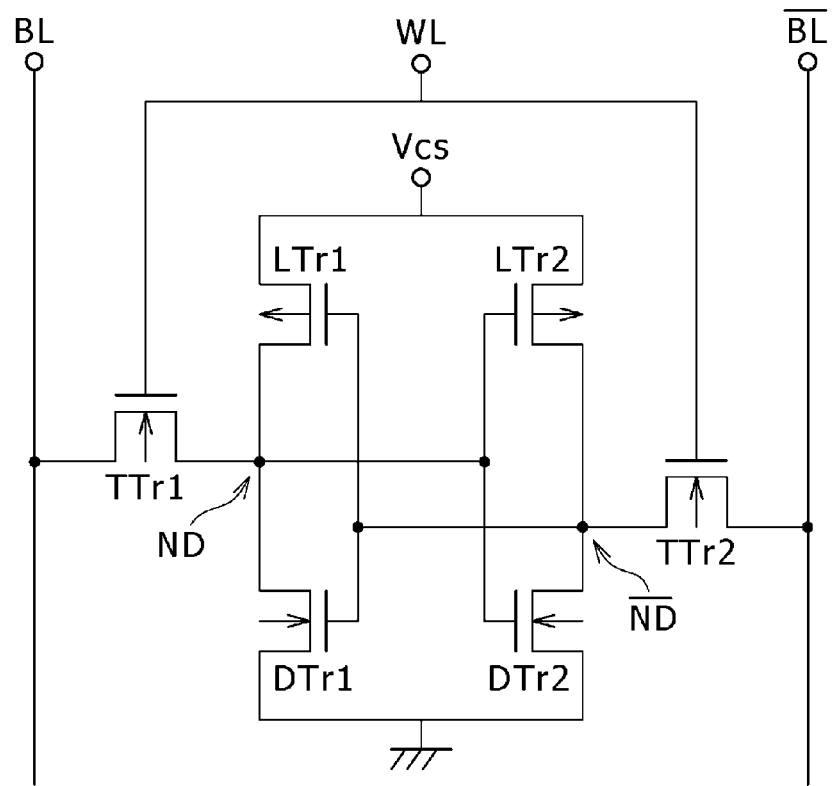
FIG. 20A is an equivalent circuit diagram of an SRAM memory cell having six MOSFETs according to a related art.
Figure 20B:
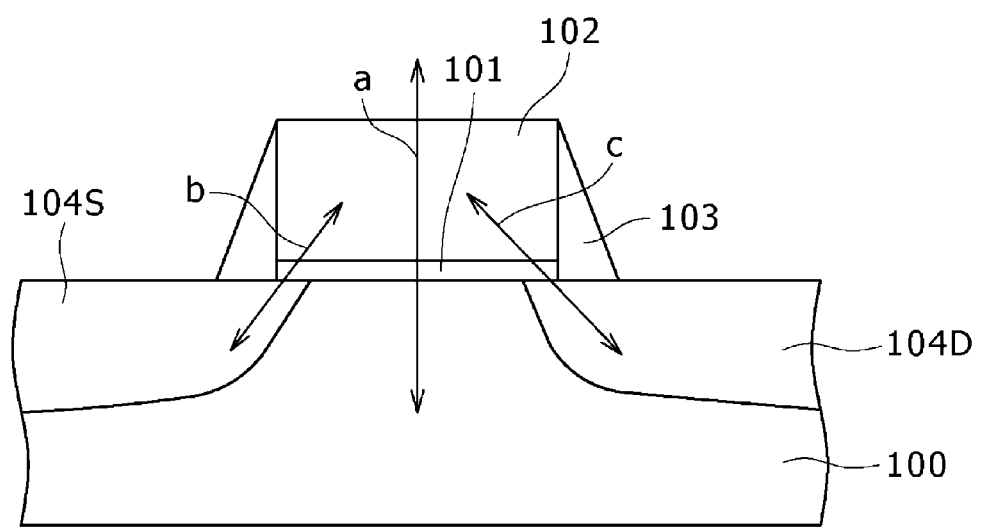
FIG. 20B is a schematic sectional view for explaining three leakage paths that exist across the gate insulating film of each transistor.
Figure 21:
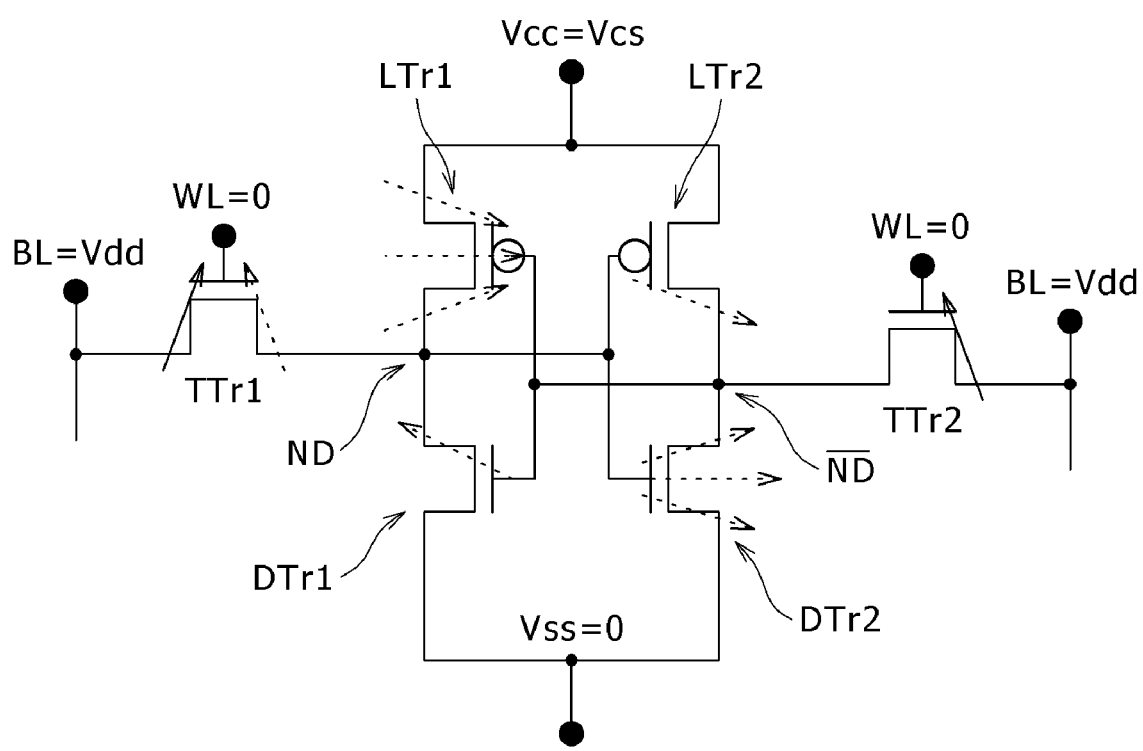
FIG. 21 is a schematic diagram for explaining leakage in the standby state in which a memory node ND is at High and a memory node $\overline{ND}$ is at Low.

FIG. 19 is a sectional view of a memory cell in an SRAM according to a fourth embodiment of the present invention, and is equivalent to the sectional view along line X-X' in FIG. 2B for the first embodiment.

Similarly to the first embodiment, at least the memory-node-side end of the gate insulating film of the first driver transistor DTr1, the memory-node-side end of the gate insulating film of the second driver transistor DTr2, the memory-node-side end of the gate insulating film of the first load transistor LTr1, and the memory-node-side end of the gate insulating film of the second load transistor LTr2 have a thickness larger than that of the gate insulating film of the other part.

In the present embodiment, for example, the gate insulating film of the first driver transistor DTr1, the gate insulating film of the second driver transistor DTr2, the gate insulating film of the first load transistor LTr1, and the gate insulating film of the second load transistor LTr2 have a thickness larger than that of the gate insulating film of the first transfer transistor TTr1 and the gate insulating film of the second transfer transistor TTr2. In addition, in each of the first driver transistor DTr1, the second driver transistor DTr2, the first load transistor LTr1, the second load transistor LTr2, the first transfer transistor TTr1, and the second transfer transistor TTr2, the memory-node-side end of the gate insulating film has a thickness larger than that of the other part.

Except for this feature, the fourth embodiment is substantially the same as the first embodiment.

In the semiconductor memory device of the present embodiment, regarding the gate insulating films of six transistors included in the memory cell, the part to which a relatively-high voltage is applied during the standby state and thus across which leakage easily occurs in the standby state is designed to have a larger thickness, which makes it possible to reduce the standby leakage.

For example, if Vcs is 1.2 V and Vdd is 1.0 V, in order to reduce the standby leakage, the thickness of the node-side end parts of the gate insulating films of the driver transistor and the load transistor is set to 1.8 nm, and the thickness of the other part of the gate insulating films of the driver transistor and the load transistor is set to 1.6 nm. Furthermore, the thickness of the node-side end part of the gate insulating film of the transfer transistor is set to 1.6 nm, and the thickness of the other part of the gate insulating film of the transfer transistor is set to 1.4 nm.

Fifth Embodiment

Table 4 shows the result of ranking of the stress states of the channel part, the Node end, and the power supply end of the respective transistors, derived from the voltages applied to the respective parts and the voltage application times in the standby state in the case in which the internal supply voltage to the inverters of each memory cell is equal to the external supply voltage applied to the bit lines.

TABLE 4

|  | Ch part | Node end | power supply end |
|---|---|---|---|
| area | large | small | small |
| LTr | B | A | B |
| DTr | B | A | B |
| TTr | C | B | A |

In Table 4, the stress state of the part to which the voltage Vcs is always applied during the standby state is ranked as A. The stress state of the part to which the voltage Vcs is applied for the time half the standby time is ranked as B. The stress state of the part to which only a voltage equal to or lower than Vdd is applied is ranked as C.

When a dual power supply is employed like in the above-described embodiments, the application state of the high voltage Vcs is the important factor regarding the stress in the standby state of the SRAM. On the other hand, when a single power supply is employed, i.e., when Vdd is equal to Vcs, attention is paid only on the application time of Vdd regarding the stress.

According to Table 4, when a single power supply is employed, the configuration of the second embodiment will provide little advantageous effect, but the configuration of the first embodiment will achieve the advantageous effect.

Specifically, when a single power supply is employed (Vdd=Vcs), the following configuration is effective. More specifically, similarly to the first embodiment, at least the memory-node-side end of the gate insulating film of the first driver transistor DTr1, the memory-node-side end of the gate insulating film of the second driver transistor DTr2, the memory-node-side end of the gate insulating film of the first load transistor LTr1, and the memory-node-side end of the gate insulating film of the second load transistor LTr2 have a thickness larger than that of the gate insulating film of the other part. For example, the gate insulating film of the first driver transistor DTr1, the gate insulating film of the second driver transistor DTr2, the gate insulating film of the first load transistor LTr1, and the gate insulating film of the second load transistor LTr2 have a thickness larger than that of the gate insulating film of the first transfer transistor TTr1 and the gate insulating film of the second transfer transistor TTr2.

In the semiconductor memory device of the present embodiment, regarding the gate insulating films of six transistors included in the memory cell, the part to which a relatively-high voltage is applied during the standby state and thus across which leakage easily occurs in the standby state is designed to have a larger thickness, which makes it possible to reduce the standby leakage.

The present invention is not limited to the above-described embodiments.

For example, only the memory-node-side end of the gate insulating film of the first driver transistor, the memory-node-side end of the gate insulating film of the second driver transistor, the memory-node-side end of the gate insulating film of the first load transistor, and the memory-node-side end of the gate insulating film of the second load transistor may have a larger thickness.

In addition, other various changes may be made without departing from the idea of the present invention.

The semiconductor memory devices according to the embodiments of the present invention can be applied to e.g. an SRAM in which each one memory cell has six MOSFETs.

The methods for manufacturing a semiconductor memory device according to the embodiments of the present invention can be applied to e.g. a method for manufacturing an SRAM in which each one memory cell has six MOSFETs.

It should be understood by those skilled in the art that various modifications, combinations, sub-combinations and alternations may occur depending on design requirements and other factors insofar as they are within the scope of the appended claims or the equivalent thereof.

What is claimed is:

1. A semiconductor memory device comprising a plurality of memory cells configured to be integrated in the semiconductor memory device, wherein:

each memory device includes a first inverter, a second inverter, a first transfer transistor, and a second transfer transistor, the first inverter having a first driver transistor and a first load transistor formed over a semiconductor substrate, the first inverter including a first memory node, the second inverter having a second driver transistor and a second load transistor formed over the semiconductor substrate, the second inverter including a second memory node, the first transfer transistor being connected to the first memory node, the second transfer transistor being connected to the second memory node, the memory cell being connected to a bit line via the first transfer transistor and being connected to a complementary bit line via the second transfer transistor;

a supply voltage applied to the bit line and the complementary bit line is lower than a supply voltage applied to a source/drain region of the first load transistor on an opposite side to the first memory node and a source/drain region of the second load transistor on an opposite side to the second memory node;

at least a memory-node-side end of a gate insulating film of the first driver transistor, a memory-node-side end of a gate insulating film of the second driver transistor, a memory-node-side end of a gate insulating film of the first load transistor, and a memory-node-side end of a gate insulating film of the second load transistor have a thickness larger than a thickness of a gate insulating film of the other part; and the gate insulating film of the first driver transistor, the gate insulating film of the second driver transistor, the gate insulating film of the first load transistor, and the gate insulating film of the second load transistor have a thickness larger than a thickness of a gate insulating film of the first transfer transistor and a gate insulating film of the second transfer transistor.

2. A semiconductor memory device comprising a plurality of memory cells configured to be integrated in the semiconductor memory device, wherein:

each memory device includes a first inverter, a second inverter, a first transfer transistor, and a second transfer transistor, the first inverter having a first driver transistor and a first load transistor formed over a semiconductor substrate, the first inverter including a first memory node, the second inverter having a second driver transistor and a second load transistor formed over the semiconductor substrate, the second inverter including a second memory node, the first transfer transistor being connected to the first memory node, the second transfer transistor being connected to the second memory node, the memory cell being connected to a bit line via the first transfer transistor and being connected to a complementary bit line via the second transfer transistor;

a supply voltage applied to the bit line and the complementary bit line is lower than a supply voltage applied to a source/drain region of the first load transistor on an opposite side to the first memory node and a source/drain region of the second load transistor on an opposite side to the second memory node;

at least a memory-node-side end of a gate insulating film of the first driver transistor, a memory-node-side end of a gate insulating film of the second driver transistor, a memory-node-side end of a gate insulating film of the first load transistor, and a memory-node-side end of a gate insulating film of the second load transistor have a thickness larger than a thickness of a gate insulating film of the other part;

the gate insulating film of the first driver transistor, the gate insulating film of the second driver transistor, the gate insulating film of the first load transistor, and the gate insulating film of the second load transistor have a thickness larger than a thickness of a gate insulating film of the first transfer transistor and a gate insulating film of the second transfer transistor; and in each of the first driver transistor, the second driver transistor, the first load transistor, the second load transistor, the first transfer transistor, and the second transfer transistor, the memory-node-side end of the gate insulating film has a thickness larger than a thickness of the other part.

3. A method for manufacturing a semiconductor memory device in which a plurality of memory cells are integrated, each of the memory cells including a first inverter, a second inverter, a first transfer transistor, and a second transfer transistor, the first inverter having a first driver transistor and a first load transistor formed over a semiconductor substrate, the first inverter including a first memory node, the second inverter having a second driver transistor and a second load transistor formed over the semiconductor substrate, the second inverter including a second memory node, the first transfer transistor being connected to the first memory node, the second transfer transistor being connected to the second memory node, the memory cell being connected to a bit line via the first transfer transistor and being connected to a complementary bit line via the second transfer transistor, a supply voltage applied to the bit line and the complementary bit line being lower than a supply voltage applied to a source/drain region of the first load transistor on an opposite side to the first memory node and a source/drain region of the second load transistor on an opposite side to the second memory node, the method comprising the step of:

in formation of gate insulating films of the first driver transistor, the second driver transistor, the first load transistor, the second load transistor, the first transfer transistor, and the second transfer transistor, increasing a thickness of at least a memory-node-side end of the gate insulating film of the first driver transistor, a memory-node-side end of the gate insulating film of the second driver transistor, a memory-node-side end of the gate insulating film of the first load transistor, and a memory-node-side end of the gate insulating film of the second load transistor compared with the gate insulating film of the other part, wherein, in the formation of the gate insulating films of the first driver transistor, the second driver transistor, the first load transistor, the second load transistor, the first transfer transistor, and the second transfer transistor, the gate insulating film of the first driver transistor, the gate insulating film of the second driver transistor, the gate insulating film of the first load transistor, and the gate insulating film of the second load transistor are increased in thickness compared with the gate insulating film of the first transfer transistor and the gate insulating film of the second transfer transistor.

4. A method for manufacturing a semiconductor memory device in which a plurality of memory cells are integrated, each of the memory cells including a first inverter, a second inverter, a first transfer transistor, and a second transfer transistor, the first inverter having a first driver transistor and a first load transistor formed over a semiconductor substrate, the first inverter including a first memory node, the second inverter having a second driver transistor and a second load transistor formed over the semiconductor substrate, the second inverter including a second memory node, the first transfer transistor being connected to the first memory node, the second transfer transistor being connected to the second memory node, the memory cell being connected to a bit line via the first transfer transistor and being connected to a complementary bit line via the second transfer transistor, a supply voltage applied to the bit line and the complementary bit line being lower than a supply voltage applied to a source/drain region of the first load transistor on an opposite side to the first memory node and a source/drain region of the second load transistor on an opposite side to the second memory node, the method comprising the step of:

in formation of gate insulating films of the first driver transistor, the second driver transistor, the first load transistor, the second load transistor, the first transfer transistor, and the second transfer transistor, increasing a thickness of at least a memory-node-side end of the gate insulating film of the first driver transistor, a memory-node-side end of the gate insulating film of the second driver transistor, a memory-node-side end of the gate insulating film of the first load transistor, and a memory-node-side end of the gate insulating film of the second load transistor compared with the gate insulating film of the other part, wherein, in the formation of the gate insulating films of the first driver transistor, the second driver transistor, the first load transistor, the second load transistor, the first transfer transistor, and the second transfer transistor, the gate insulating film of the first driver transistor, the gate insulating film of the second driver transistor, the gate insulating film of the first load transistor, and the gate insulating film of the second load transistor are increased in thickness compared with the gate insulating film of the first transfer transistor and the gate insulating film of the second transfer transistor, and for each of the first driver transistor, the second driver transistor, the first load transistor, the second load transistor, the first transfer transistor, and the second transfer transistor, the memory-node-side end of the gate insulating film is increased in thickness compared with the other part.

5. The method for manufacturing a semiconductor memory device according to claim 3, wherein in the formation of the gate insulating films of the first driver transistor, the second driver transistor, the first load transistor, the second load transistor, the first transfer transistor, and the second transfer transistor, a plurality of times of oxide film forming treatment are performed for a part that is to be increased in thickness, including at least the memory-node-side end of the gate insulating film of the first driver transistor, the memory-node-side end of the gate insulating film of the second driver transistor, the memory-node-side end of the gate insulating film of the first load transistor, and the memory-node-side end of the gate insulating film of the second load transistor, and only one time of oxide film forming treatment is performed for the other part.

6. The method for manufacturing a semiconductor memory device according to claim 3, wherein in the formation of the gate insulating films of the first driver transistor, the second driver transistor, the first load transistor, the second load transistor, the first transfer transistor, and the second transfer transistor, impurity introduction and enhanced oxidation treatment are performed for a part that is to be increased in thickness, including at least the memory-node-side end of the gate insulating film of the first driver transistor, the memory-node-side end of the gate insulating film of the second driver transistor, the memory-node-side end of the gate insulating film of the first load transistor, and the memory-node-side end of the gate insulating film of the second load transistor.

* * * * *